United States Patent
Taniguchi et al.

(10) Patent No.: US 6,784,743 B2
(45) Date of Patent: Aug. 31, 2004

(54) HIGH FREQUENCY AMPLIFIER AND FREQUENCY MIXER

(75) Inventors: Eiji Taniguchi, Tokyo (JP); Noriharu Suematsu, Tokyo (JP); Chiemi Sawaumi, Tokyo (JP); Kenichi Maeda, Tokyo (JP); Takayuki Ikushima, Tokyo (JP); Hiroyuki Joba, Tokyo (JP); Tadashi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/182,397
(22) PCT Filed: May 17, 2001
(86) PCT No.: PCT/JP01/04136
§ 371 (c)(1),
(2), (4) Date: Jul. 30, 2002
(87) PCT Pub. No.: WO02/45254
PCT Pub. Date: Jun. 6, 2002

(65) Prior Publication Data
US 2003/0001677 A1 Jan. 2, 2003

(30) Foreign Application Priority Data
Dec. 1, 2000 (WO) .............................. PCT/JP00/08546

(51) Int. Cl.[7] .............................................. H03F 3/19
(52) U.S. Cl. ...................................... 330/285; 327/491
(58) Field of Search ............................... 330/285, 296, 330/136; 327/356, 358, 491

(56) References Cited
U.S. PATENT DOCUMENTS 4,420,726 A * 12/1983 Limberg ..................... 330/288
4,755,741 A * 7/1988 Nelson ....................... 323/289
5,060,294 A * 10/1991 Schwent et al. ............... 455/93
5,436,595 A 7/1995 Wholey et al. ............. 330/296

FOREIGN PATENT DOCUMENTS

| EP | 634835 | 1/1995 |
| JP | 5-22075 | 1/1993 |
| JP | 9-260964 | 10/1997 |
| JP | 10-98336 | 4/1998 |
| JP | 2000-196363 | 4/2000 |
| JP | 2000-252766 | 9/2000 |

OTHER PUBLICATIONS

E. Taniguchi et al.: "Dual bias feed type SiGe HBT linear low noise amplifier" 2001 Annual Meeting of the Institute of Electronics, Information and Communication Engineers, p. 50 2001.

M. Soyuer et al.: "A 5.8GHz 1–V low–noise amplifier in SiGe bipolar technology" IEEE Radio Frequency Integrated Circuits Symposium, pp. 19–22 1997.

* cited by examiner

Primary Examiner—Linh M. Nguyen
(74) Attorney, Agent, or Firm—Oblon, Spivak, McClelland, Maier & Neustadt, P.C.

(57) ABSTRACT

A high frequency amplifier in which a common emitter bipolar transistor is used, and in that a constant current source and a constant voltage source are switched to apply a DC bias to a base terminal of the bipolar transistor in accordance with a power level of a high frequency signal input to the bipolar transistor or a power level of a high frequency signal output therefrom, and a frequency mixer in that a DC bias is applied to a base of at least one of a bipolar transistor for the input of a high frequency signal and a bipolar transistor for the input of a local oscillation wave by using a configuration for applying the DC bias to a base of an amplifying bipolar transistor employed in the high frequency amplifier.

25 Claims, 25 Drawing Sheets

HIGH FREQUENCY SIGNAL POWER INPUT (dBm)

HIGH FREQUENCY SIGNAL POWER INPUT (dBm)

HIGH FREQUENCY AMPLIFIER AND FREQUENCY MIXER

TECHNICAL FIELD

The present invention relates to a high frequency amplifier which relaxes a drop in base potential of a bipolar transistor upon the input of a bulk power high frequency signal to thereby provide a high saturation characteristic.

The present invention also relates to a high frequency amplifier and a frequency mixer each of which relaxes a drop in base potential of a bipolar transistor upon input of a bulk power high frequency signal to thereby provide a high saturation characteristic and reduce degradation in a noise figure.

BACKGROUND ART

A conventional common emitter two stage type high frequency amplifier described in, for example, "IEEE Microwave Theory and Technology Symposium (1997) Preliminary Reports is one in that a DC bias produced from a current mirror circuit is supplied to a base terminal of a bipolar transistor as shown in FIG. 1.

In the drawing, reference numeral 1 indicates an input terminal for a high frequency signal, reference numeral 2 indicates an output terminal for the high frequency signal, reference numerals 3 indicate amplifying bipolar transistors whose emitter terminals are grounded, reference numeral 4 indicates a constant voltage source, reference numerals 8 indicate bias feed inductors for supplying a DC bias from the constant voltage source 4e to collector terminals of the amplifying bipolar transistors 3, reference numeral 9 indicates a bypass capacitor for short circuiting the high frequency signal, reference numeral 11 indicates a bias bipolar transistor, reference numeral 12 indicates a current mirror bias circuit, reference numerals 15 indicate bias feed resistors for supplying a DC bias from the current mirror bias circuit 12 to base terminals of the amplifying transistors 3, reference numerals 16 indicate DC cut capacitors, reference numerals 19 indicate bias resistors, and reference numerals 28 indicate emitter loaded inductances.

The operation will next be described.

The conventional high frequency amplifier shown in FIG. 1 amplifies the high frequency signal input from the input terminal 1 by the amplifying bipolar transistors 3 and takes out it from the output terminal 2. In order to operate the amplifying bipolar transistors 3, there is a need to supply DC biases to the collector and base terminals of the amplifying bipolar transistors 3. The collector terminals thereof are supplied with the DC bias from the constant voltage source 4e via the bias feed inductors 8, whereas the base terminals thereof are supplied with the DC bias from the current mirror bias circuit 12 via the bias feed resistors 15.

In the above described conventional high frequency amplifier, a bias current supplied from the current mirror circuit increases with an increase in the base current of each amplifying bipolar transistor upon input of the bulk power high frequency signal. Therefore, the high frequency amplifier is accompanied by a problem that a voltage drop is developed across each bias feed resistor so that a base potential of each amplifying bipolar transistor is reduced, thereby degrading a saturation characteristic.

Further, a conventional common emitter high frequency amplifier described in, for example, Preliminary Reports of Communications Society Conference of the Institute of Electronics, Information and Communication Engineers (2001) is one in that a DC bias is supplied from a current mirror bias circuit and one diode switch to a base terminal of a bipolar transistor as shown in FIG. 2.

In the drawing, reference numeral 101 indicates an input terminal for a high frequency signal, reference numeral 102 indicates an output terminal for the high frequency signal, reference numeral 103 indicates an amplifying bipolar transistor emitter terminal of which is grounded, reference numerals 104a and 104b indicate constant current sources, reference numeral 105a indicates a constant voltage source, reference numerals 106a and 106b indicate bias bipolar transistors, reference numeral 107 indicates a bias feed resistor for supplying the DC bias to the base terminal of the amplifying bipolar transistor 103, reference numerals 108a and 108b indicate bias resistors, reference numeral 109 indicates a current mirror bias circuit which comprises the constant current source 104a, the constant voltage source 105a, the bias bipolar transistors 106a and 106b, the bias feed resistor 107 and the bias resistors 108a and 108b, reference numeral 112a indicates a switch bipolar transistor, reference numerals 113a and 113b indicate reference voltage bipolar transistors, and reference numeral 111 indicates a base bias compensating circuit which comprises the constant voltage source 104b, the switch bipolar transistor 112a and the reference voltage bipolar transistors 113a and 113b.

The operation will now be described below.

The conventional high frequency amplifier shown in FIG. 2 is one in that the high frequency signal input from the input terminal 101 is amplified by the amplifying bipolar transistor 103, followed by extraction thereof from the output terminal 102. When the high frequency signal power input to the input terminal 101 is sufficiently low, i.e., upon a linear operation of the amplifying bipolar transistor 103, the DC bias to the base terminal of the amplifying bipolar transistor 103 is supplied mainly from the current mirror bias circuit 109. When the high frequency signal power input to the input terminal 101 is high, i.e., upon a non linear operation of the amplifying bipolar transistor 103, the DC bias is mainly supplied from the base bias compensating circuit 111. Therefore, an improvement in saturation characteristic is performed by relaxing a drop in base potential VBE of the amplifying bipolar transistor 103 with an increase in the high frequency signal power.

The operation of the base bias compensating circuit 111 will now be described below.

The switch bipolar transistor 112a is a diode switch whose base terminal and collector terminals are short circuit connected. Such a switch is turned on/off by a difference in potential between the emitter terminal and the collector/base terminals. When the switch is turned on, a current flows between the collector and emitter thereof, whereas when it is turned off, no current ideally flows. Here, a voltage to be required for turning on the switch (Hereinafter refereed to as "on voltage of the switch") is defined as VSW_ON.

Upon turning off of the diode switch, a current IREF1 generated by the constant current source 104b flows into the two reference voltage generating bipolar transistors 113a and 113b whose base terminals and collector terminals are short circuit connected. Owing to the current IREF1, a voltage of VREF is produced at the base/collector terminal of the reference voltage bipolar transistor 113a.

When the diode switch is turned off, i.e., a condition VSW_ON>VREF−VBE is established with respect to the base potential VBE of the amplifying bipolar transistor 103, no current flows from the base bias compensating circuit 111 to the base terminal of the amplifying bipolar transistor 103.

On the other hand, when the diode switch is turned on, i.e., a condition VSW_ON<VREF−VBE is established, a current flows between the collector and emitter of the switch bipolar transistor 112a and it is supplied to the base terminal of the amplifying bipolar transistor 103 as a DC bias.

As described above, the base bias compensating circuit 111 supplies the DC bias to the base terminal as it is driven by the base potential VBE of the amplifying bipolar transistor 103, i.e., in response that the power of the high frequency signal input to the input terminal 101 increases.

In the above described conventional high frequency amplifier, though the drop in base potential is relaxed by virtue of an increase in the amount of supply of the current to the base terminal of the amplifying bipolar transistor by the base bias compensating circuit upon input of the bulk power high frequency signal to thereby enhance the saturation characteristic, whereas it is accompanied by a problem that the impedance of the base bias compensating circuit is lowered in accordance with the increase in the amount of supply of the current, thereby degrading a noise figure.

The present invention has been made to solve such a problem as described above (as in the conventional example shown in FIG. 1) and aims to realize a high frequency amplifier and a frequency mixer each of which relaxes a drop in base potential of a bipolar transistor upon input of a bulk power high frequency signal to thereby provide a high saturation characteristic.

Further, the present invention has been made to solve such a problem as described above (as in the conventional example shown in FIG. 2) and aims to implement a high frequency amplifier and a frequency mixer each of which relaxes a drop in base potential of a bipolar transistor upon input of a bulk power high frequency signal to thereby provide a high saturation characteristic and reduce degradation in a noise figure.

DISCLOSURE OF INVENTION

A high frequency amplifier according to the present invention is one in which a common emitter bipolar transistor is used, and a constant current source and a constant voltage source are switched to apply a DC bias to a base terminal of the bipolar transistor in accordance with a power level of a high frequency signal input to the bipolar transistor or a power level of a high frequency signal output therefrom.

Because of this arrangement, an effect is brought about by that a high frequency amplifier can be obtained which simultaneously satisfies high resistance to a change in power supply voltage and variations in the characteristic of a transistor which is an advantage at a constant current operation, and a high saturation characteristic which is an advantage at a constant voltage operation.

A high frequency amplifier according to the present invention is one in that the constant current source is always connected to its corresponding base terminal.

Because of this arrangement, an effect is brought about by that a high frequency amplifier can be obtained which simultaneously satisfies high resistance to a change in power supply voltage and variations in the characteristic of a transistor, which is an advantage at a constant current operation, and a high saturation characteristic which is an advantage at a constant voltage operation. Also an effect is brought about by that since the constant current source is always connected to the base terminal, biasing from the constant current source is performed even upon switching between the constant current source and the constant voltage source in accordance with the transition of the amplifying bipolar transistor from its linear operation to its non-linear operation and the transition thereof from the non-linear operation to the linear operation, whereby the base potential of the transistor is biased stably.

A high frequency amplifier according to the present invention is one in that the constant voltage source is connected to the base terminal of the bipolar transistor through a resistor.

Because of this arrangement, an effect is brought about by that a high frequency amplifier can be obtained which simultaneously satisfies high resistance to a change in power supply voltage and variations in the characteristic of a transistor, which is an advantage at a constant current operation, and a high saturation characteristic which is an advantage at a constant voltage operation. Also an effect is brought about by that a threshold value for starting the supply of a bias from the constant voltage source can be changed by changing the voltage of the constant voltage source.

A high frequency amplifier according to the present invention is one in that a DC bias is supplied to a base terminal of the bipolar transistor by a current mirror bias circuit, and a base bias compensating circuit which comprises a constant current source and a switch driven by a base potential and one terminal of the switch is connected to the base terminal of the bipolar transistor and the other terminal thereof is connected to the constant current source, is provided at the base terminal of the bipolar transistor.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic.

A high frequency amplifier according to the present invention is one in that the constant current source constituting the base bias compensating circuit is implemented by a resistor and a constant voltage source, said switch is configured as a diode switch in which a base and collector of a bipolar transistor are short-circuit connected, an emitter terminal of the diode switch is connected to the base terminal of the common emitter bipolar transistor, a collector/base terminals thereof are connected to the resistor, and a reference voltage for the diode switch is supplied from series-connected diode switches more than at least one.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic. Also an effect is brought about by that since IREF, VREF and VSWON of the base bias compensating circuit in the high frequency amplifier can be arbitrarily set according to the resistance value of a bias resistor, the size of a reference voltage bipolar transistor, and the size of a switch bipolar transistor, respectively, a switching threshold value of the base bias compensating circuit can be changed.

A high frequency amplifier according to the present invention is one in that the base bias compensating circuit is connected to the base terminal of the common emitter bipolar transistor through a resistor.

Because of this arrangement, an effect is brought about by that the impedance of the base bias compensating circuit as viewed from the base terminal increases and hence degradation of a noise figure of the high frequency amplifier can be suppressed.

A high frequency amplifier according to the present invention is one in that a DC bias voltage is supplied through a resister to a base terminal of the bipolar transistor by a current mirror bias circuit, and a base bias compensating circuit which comprises a constant current source and a switch driven by a base potential and one terminal of the switch is connected to the constant current source and the base terminal of the bipolar transistor and the other terminal thereof is grounded, is provided at the base terminal of the bipolar transistor.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic.

A high frequency amplifier according to the present invention is one in that a constant current source constituting a base bias compensating circuit is implemented by a resistor and a constant voltage source, a switch is configured as a diode switch in which a base and collector of a bipolar transistor are short-circuit connected, collector/base terminals of the diode switch are connected to the base terminal of the common emitter bipolar transistor, and an emitter terminal thereof is grounded.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic. Also an effect is brought about by that since VSWON of the base bias compensating circuit can be changed by changing the number of switch bipolar transistors, a switching threshold value of the base bias compensating circuit can be changed.

A high frequency amplifier according to the present invention is one in that the base bias compensating circuit is connected to the base terminal of a common emitter bipolar transistor through a resistor.

Because of this arrangement, an effect is brought about by that the impedance of the base bias compensating circuit as viewed from the base terminal increases and hence degradation of a noise figure of the high frequency amplifier can be suppressed.

A frequency mixer according to the present invention is one in that a DC bias is applied to a base of at least one of a bipolar transistor for the input of a high frequency signal and a bipolar transistor for the input of a local oscillation wave by using a configuration for applying the DC bias in the high frequency amplifier according to the present invention.

Because of this arrangement, an effect is brought about by that a frequency mixer can be obtained which simultaneously satisfies high resistance to a change in power supply voltage and variations in the characteristic of a transistor, which is an advantage at a constant current operation, and a high saturation characteristic which is an advantage at a constant voltage operation.

A high frequency amplifier according to the present invention is one in that a common emitter bipolar transistor is used and a DC bias is supplied to abase terminal of the bipolar transistor by a current mirror bias circuit, characterized in that a base bias compensating circuit which comprises a constant current source and series-connected two switches driven by a base potential of the bipolar transistor and one terminal of the series-connected switches is connected to the base terminal of the bipolar transistor and the other terminal thereof is connected to the constant current source, is provided.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic. That is to say, an effect is brought about by that when a high frequency signal having low power is input, a constant current operation which shows low dependency on a change in power supply voltage and being good against a process variations of each transistor is achieved by the DC bias supplied mainly from the current mirror bias circuit, and when a bulk power high frequency signal is input, a constant voltage operation which shows a high saturation characteristic is achieved by the DC bias supplied mainly from the base bias compensating circuit, then both can be implemented simultaneously.

Further, an effect is brought about by that since the impedance can be increased by connecting selector switches in series, degradation in a noise figure can be reduced.

A high frequency amplifier according to the present invention is one in that a constant current source constituting the base bias compensating circuit is implemented by a resistor and a constant voltage source, each of said switches is configured as a diode switch in which a base and collector of a bipolar transistor are short-circuit connected, an emitter terminal of the first diode switch thereof and collector/base terminals of the second diode switch thereof are connected in series, an emitter terminal of the second diode switch is connected to the base terminal of the common emitter bipolar transistor, collector/base terminals of the first diode switch are connected to the resistor, and a reference voltage for the diode switches is supplied from series-connected diode switches more than at least one.

Because of this arrangement, an effect is brought about by that a high frequency amplifier can be obtained which relaxes a drop in base potential of an amplifying bipolar transistor in accordance with the input of a bulk power high frequency signal and provides a high saturation characteristic. That is to say, an effect is brought about by that when a high frequency signal having low power is input, a constant current operation which shows low dependency on a change in power supply voltage and being good against a process variations of each transistor is achieved by the DC bias supplied mainly from the current mirror bias circuit, and when a bulk power high frequency signal is input, a constant voltage operation which shows a high saturation characteristic is achieved by the DC bias supplied mainly from the base bias compensating circuit, then both can be implemented simultaneously.

Further, an effect is brought about by that since the impedance can be increased by connecting selector switches in series, degradation in a noise figure can be reduced.

A high frequency amplifier according to the present invention is one in that a common emitter bipolar transistor is used and a DC bias is supplied to abase terminal of the bipolar transistor by a constant current source and a resistor characterized in that a base bias compensating circuit which comprises a constant current source and at least one switch driven by a base potential of the bipolar transistor and one terminal of the switch is connected to the base terminal of the bipolar transistor and the other terminal thereof is connected to the constant current source, is provided.

Because of this arrangement, an effect is brought about by that when a high frequency signal having low power is input, a constant current operation which shows low dependency on a change in power supply voltage and being good against a process variations of each transistor is achieved by the DC bias supplied mainly from the current mirror bias circuit, and when a bulk power high frequency signal is input, a constant voltage operation which shows a high saturation characteristic is achieved by the DC bias supplied mainly from the base bias compensating circuit, then both can be implemented simultaneously.

A high frequency amplifier according to the present invention is one which a common emitter bipolar transistor is used and a DC bias is supplied to a base terminal of the bipolar transistor by a current mirror bias circuit, characterized in that an emitter terminal of a base bias compensating bipolar transistor whose collector terminal and base terminal are connected to a constant voltage source, is connected to the base terminal of the common emitter bipolar transistor.

Because of this arrangement, an effect is brought about by that when a high frequency signal having low power is input, a constant current operation which shows low dependency on a change in power supply voltage and being good against a process variations of each transistor is achieved by the DC bias supplied mainly from the current mirror bias circuit, and when a bulk power high frequency signal is input, a constant voltage operation which shows a high saturation characteristic is achieved by the DC bias supplied mainly from the base bias compensating circuit, then both can be implemented simultaneously.

Further, an effect is brought about by that since an idle current at the input of a small-power high frequency signal, which flows in each reference voltage bipolar transistor becomes unnecessary, current consumption can be reduced.

A high frequency amplifier according to the present invention is one in that a constant voltage source connected to the base terminal of the base bias compensating bipolar transistor comprises a constant current source and at least one diode switch or more, each having collector/base terminals short-circuit connected.

Because of this arrangement, an effect is brought about by that a base bias compensating circuit can be made resistant to variations in power supply.

A high frequency amplifier according to the present invention is one in that a diode switch whose collector/base terminals are short-circuited, is inserted between the emitter terminal of the base bias compensating bipolar transistor and the base terminal of the common emitter bipolar transistor.

Because of this arrangement, an effect is brought about by that a decrease in the impedance of a base bias compensating circuit as viewed from an amplifying bipolar transistor can be relaxed which occurs when the current flows from the base bias compensating circuit to the base terminal of the amplifying bipolar transistor upon input of a bulk power high frequency signal, whereby degradation in a noise factor can be reduced.

A high frequency amplifier according to the present invention is one in that a resistor is inserted between an emitter terminal of the base bias compensating bipolar transistor and a base terminal of the common emitter bipolar transistor.

Because of this arrangement, an effect is brought about by that a decrease in the impedance of a base bias compensating circuit as viewed from an amplifying bipolar transistor can be relaxed which occurs when the current flows from the base bias compensating circuit to the base terminal of the amplifying bipolar transistor upon input of a bulk power high frequency signal, whereby degradation in a noise factor can be reduced.

A frequency mixer according to the present invention is one in that the above described base DC bias applying configuration of the above described high frequency amplifier is applied to at least one of a bipolar transistor for the input of a high frequency signal and a bipolar transistor for the input of a local oscillation wave.

Because of this arrangement, an effect is brought about by that a frequency mixer can be obtained which simultaneously satisfies resistance to a change in power supply voltage and variations in transistor which is an advantage at a constant current operation, and a high saturation characteristic and the effect of reducing degradation in a noise figure, each of which is an advantage at a constant voltage operation.

BEST MODE FOR CARRYING OUT THE INVENTION

In order to describe the present invention in more details, best modes for carrying out the present invention will hereinafter be described in accordance with the accompanying drawings.

Embodiment 1

Figure 1:
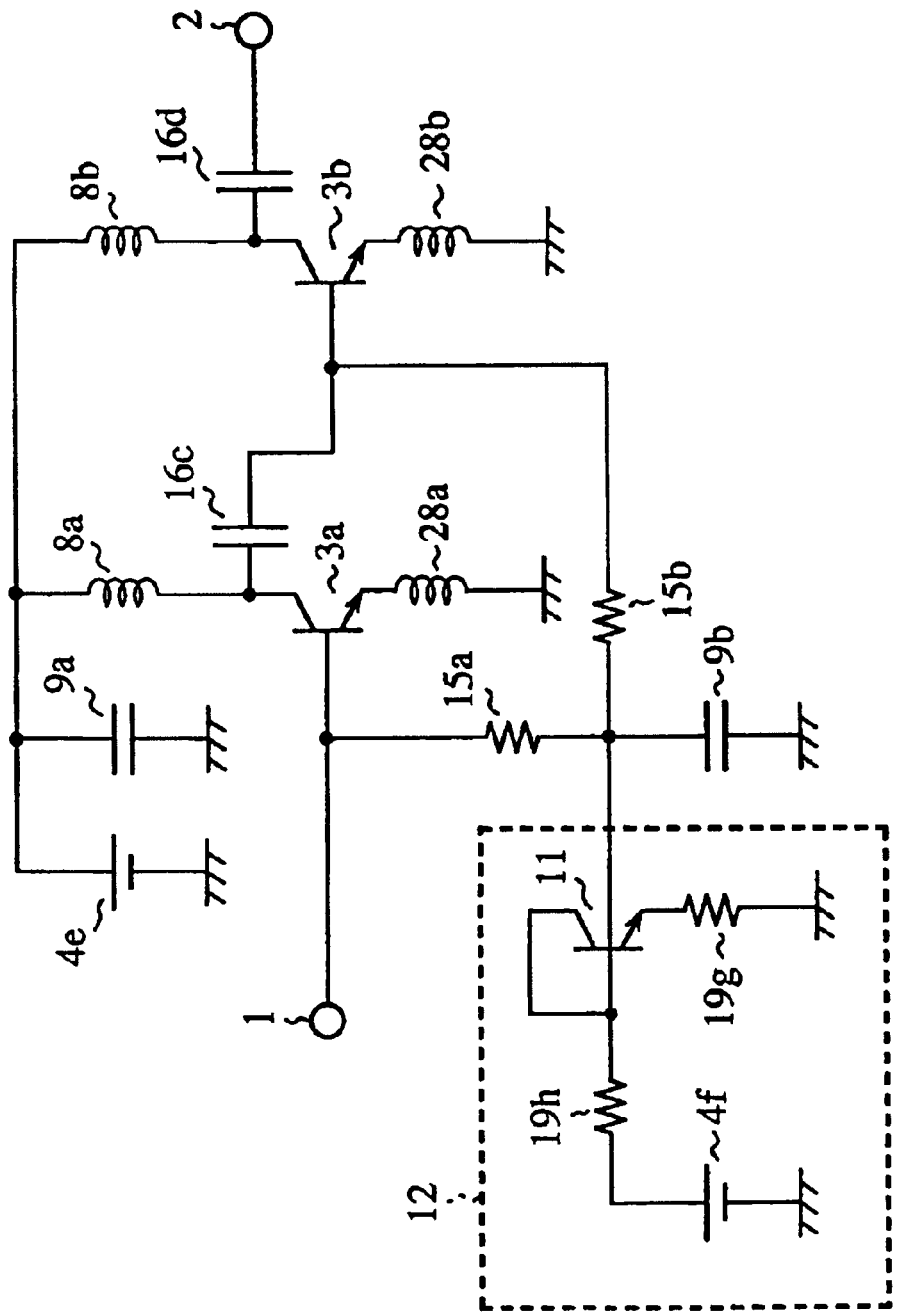
FIG. 1 is a circuit diagram to show a conventional high frequency amplifier.
Figure 2:
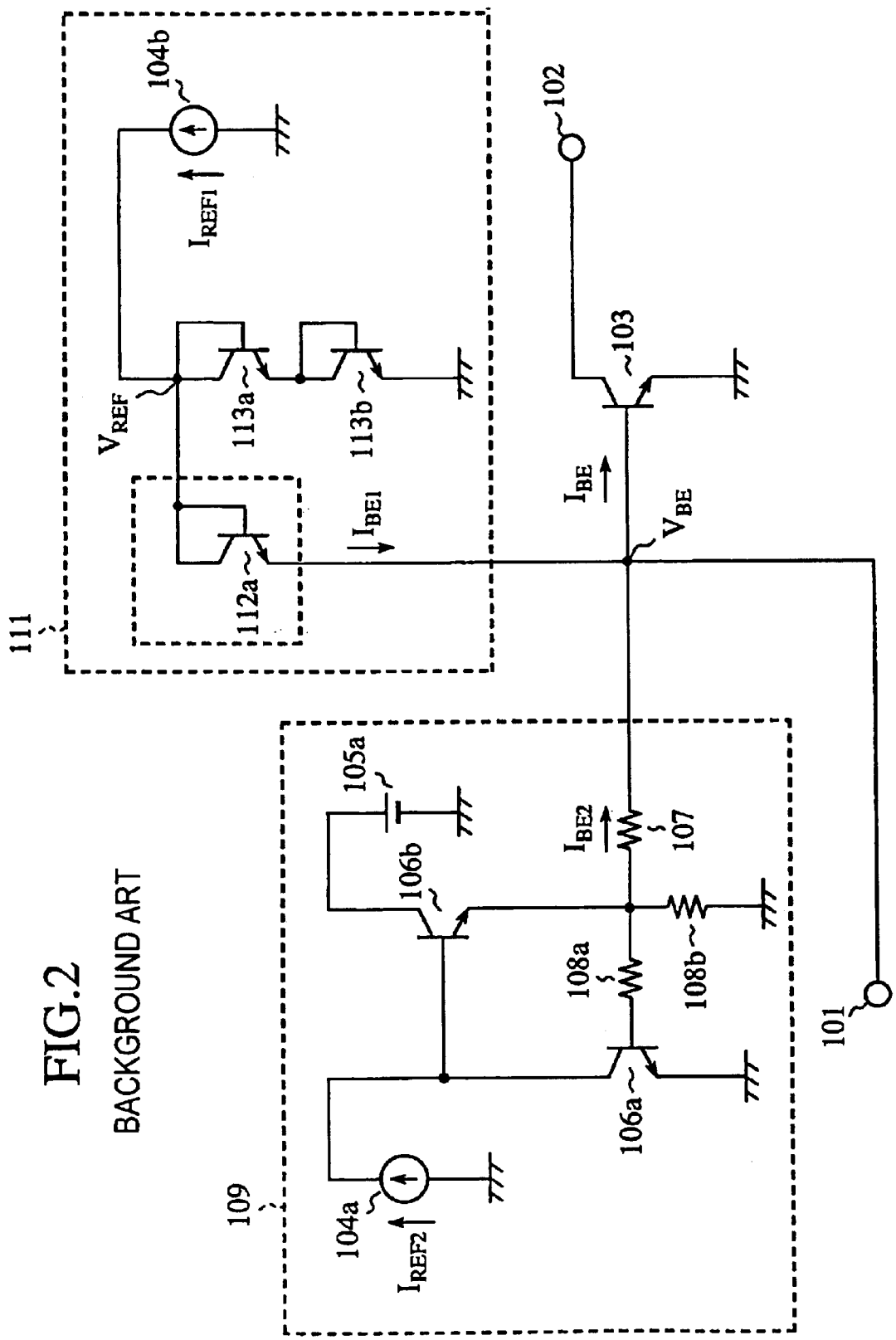
FIG. 2 is a circuit diagram to illustrate a conventional high frequency amplifier.
Figure 3:
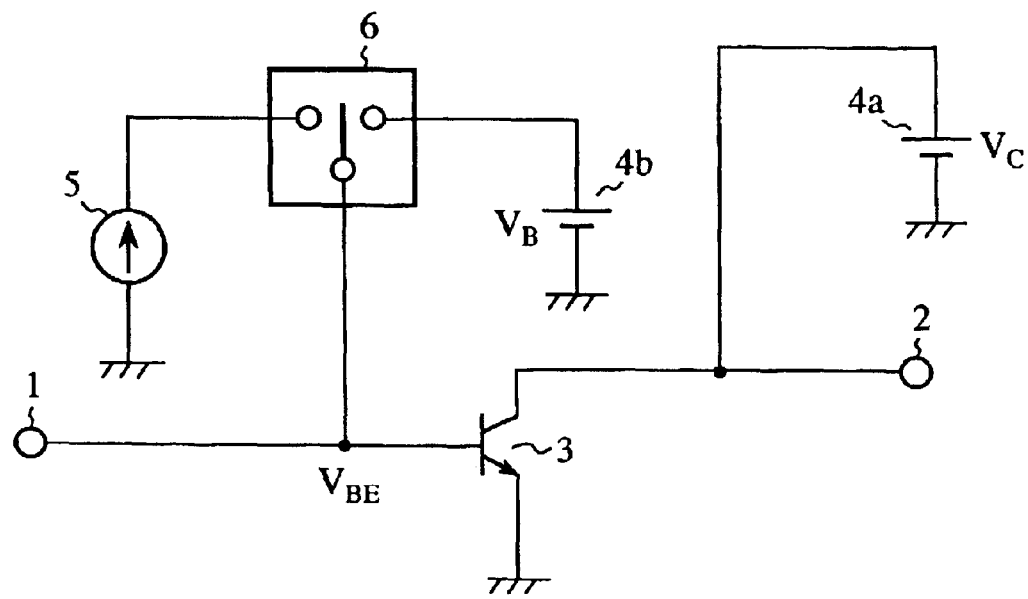
FIG. 3 is a circuit diagram to show a high frequency amplifier which is an embodiment 1 of the present invention.

FIG. 3 shows a high frequency amplifier illustrative of an embodiment 1 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4 indicates a constant voltage source, reference numeral 5 indicates a constant current source, and reference numeral 6 indicates a connecting unit for performing connection between the constant voltage source 4b and the constant current source 5, respectively.

A configuration will next be described.

The high frequency amplifier of the embodiment 1 is one in that the common emitter amplifying bipolar transistor 3 is used to apply a DC bias to a base terminal of the amplifying bipolar transistor 3 by performing switching between the constant current source 5 and the constant voltage source 4b according to a power level of the high frequency signal input to the amplifying bipolar transistor 3 or a power level of the high frequency signal output therefrom.

The operation will now be described.

The high frequency amplifier according to the present embodiment 1 is one in that the high frequency signal input from the input terminal 1 is amplified by the amplifying bipolar transistor 3, followed by being taken out from the output terminal 2. In order to operate the amplifying bipolar transistor 3, there is a need to supply a DC bias to a collector terminal and a base terminal of the amplifying bipolar transistor 3. The collector terminal of the amplifying bipolar transistor 3 is supplied with a DC bias voltage Vc from the constant voltage source 4a. The base terminal of the amplifying bipolar transistor 3 is supplied with DC biases from the constant voltage source 4b and the constant current source 5. Herein, the connecting unit 6 is brought to a conducting state on the constant current source 5 side when the power of the high frequency signal input to the input terminal 1 is sufficiently low, i.e., upon a linear operation of the amplifying bipolar transistor 3. On the other hand, the connecting unit 6 is brought to a conducting state on the constant voltage source 4b side when the high frequency signal input to the input terminal 1 is large, i.e., upon a non-linear operation of the amplifying bipolar transistor 3. Namely, a DC bias is applied from the constant current source 5 to the base terminal of the amplifying bipolar transistor 3 upon the input of a small signal. Upon the input of a large signal, a DC bias is applied from the constant voltage source 4b thereto.

Thus, a high frequency amplifier can be obtained which simultaneously satisfies high resistance to a change in power supply voltage and variations in the characteristic of a transistor, which is an advantage at a constant current operation, and a high saturation characteristic which is an advantage at a constant voltage operation.

Embodiment 2

Figure 4:
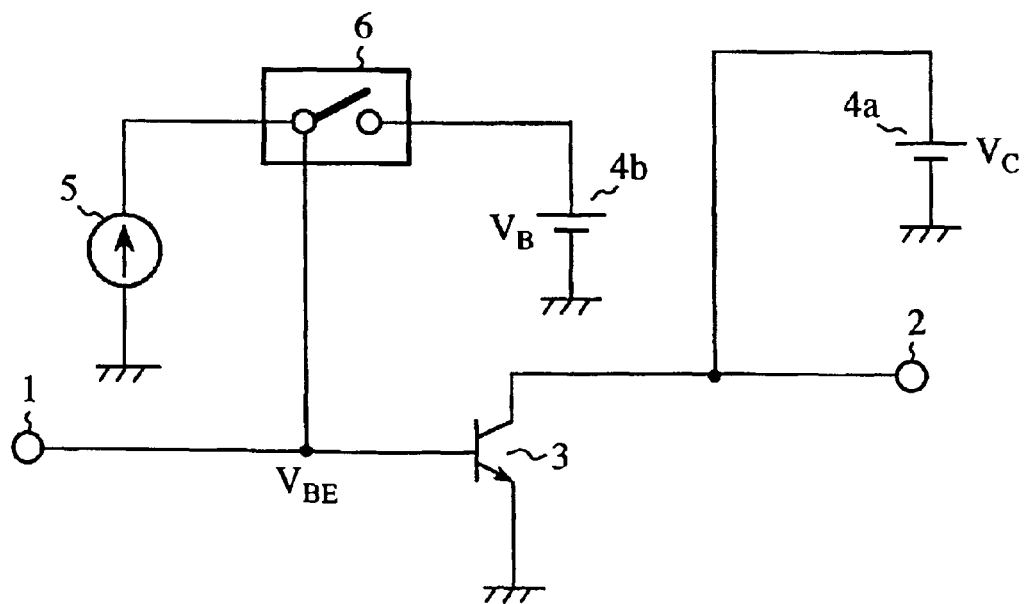
FIG. 4 is a circuit diagram to show a high frequency amplifier which is an embodiment 2 of the present invention.

FIG. 4 shows a high frequency amplifier which is an embodiment 2 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4 indicates a constant voltage source, reference numeral 5 indicates a constant current source, and reference numeral 6 indicates a connecting unit for performing connection between the constant voltage source 4b and the constant current source 5, respectively.

A configuration will next be described.

The high frequency amplifier of the embodiment 2 is one in that the common emitter amplifying bipolar transistor 3 is used to apply a DC bias to a base terminal of the amplifying bipolar transistor 3 by performing switching between the constant current source 5 and the constant voltage source 4b according to a power level of the high frequency signal input to the amplifying bipolar transistor 3 or a power level of the high frequency signal output therefrom. The constant current source 5 is always connected to the base terminal.

The operation will next be described.

The high frequency amplifier according to the present embodiment 2 is one in that the high frequency signal input from the input terminal 1 is amplified by the amplifying bipolar transistor 3, followed by being taken out from the output terminal 2. The collector terminal of the amplifying bipolar transistor 3 is supplied with a DC bias Vc from the constant voltage source 4a. The base terminal of the amplifying bipolar transistor 3 is supplied with DC biases from the constant voltage source 4b and the constant current source 5. Here, the connecting unit 6 is brought to an open state when the power of the high frequency signal input to the input terminal 1 is sufficiently low, i.e., upon a linear operation of the amplifying bipolar transistor 3. The connecting unit 6 is brought to a conducting state when the power of the high frequency signal input to the input terminal 1 is high, i.e., upon a non-linear operation of the amplifying bipolar transistor 3. Namely, a DC bias is applied from the constant current source 5 to the base terminal of the amplifying bipolar transistor 3 upon the input of a small signal. Upon the input of a large signal, a DC bias is applied from the constant current source 5 and the constant voltage source 4b thereto.

Thus, in a manner similar to the embodiment 1, a high frequency amplifier can be obtained which simultaneously satisfies high resistance to a change in power supply voltage and variations in the characteristic of a transistor, which is an advantage at a constant current operation, and a high saturation characteristic which is an advantage at a constant voltage operation. Since the constant current source 5 is always connected to the base terminal, biasing from the constant current source 5 is performed even upon switching between the constant current source 5 and the constant voltage source 4b in accordance with the transition of the amplifying bipolar transistor 3 from the linear operation to the non-linear operation and the transition thereof from the non-linear operation to the linear operation. Consequently, the potential at the base of the transistor is biased stably.

Embodiment 3

Figure 5:
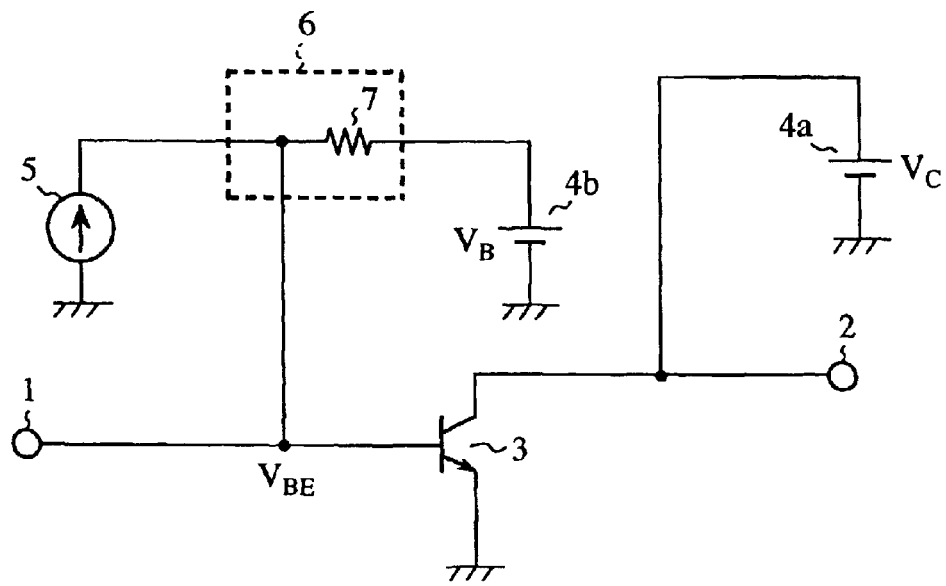
FIG. 5 is a circuit diagram to show a high frequency amplifier which is an embodiment 3 of the present invention.

FIG. 5 shows a high frequency amplifier illustrative of an embodiment 3 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4 indicates a constant voltage source, reference numeral 5 indicates a constant current source, reference numeral 6 indicates a connecting unit for performing connection between the constant voltage source 4b and the constant current source 5, and reference numeral 7 indicates a bias resistor, respectively.

A configuration will next be described.

The high frequency amplifier of the embodiment 3 is one in that the common emitter amplifying bipolar transistor 3 is used to apply a DC bias to a base terminal of the amplifying bipolar transistor 3 by performing switching between the constant current source 5 and the constant voltage source 4b according to a power level of the high frequency signal input to the amplifying bipolar transistor 3 or a power level of the high frequency signal output therefrom. The constant current source 5 is always connected to the base terminal. The constant voltage source (4b) is connected to the base terminal of the bipolar transistor 3 via the resistor (7).

The operation will next be described.

The high frequency amplifier according to the embodiment 3 is one for amplifying the high frequency signal input from the input terminal 1 by the amplifying bipolar transistor 3 and taking out it from the output terminal 2. A collector terminal of the amplifying bipolar transistor 3 is supplied with a DC bias from the constant voltage source 4a, whereas the base terminal thereof is supplied with DC biases from the constant voltage source 4b and the constant current source 5. Here, a voltage value VB of the constant voltage source 4b is set as VB<VBES with respect to a base potential VBES at a linear operation of the amplifying bipolar transistor 3, and the resistance value of the bias resistor 7 is set to a small value.

As to the base potential VBE of the amplifying bipolar transistor 3, a value VBEL at its non-linear operation becomes lower than the value VBES at its linear operation. This results from the following reason. Namely, when the input voltage increases and exceeds the difference between the bias voltage VB supplied to the base terminal and an on voltage Vth of a diode between the base and emitter of the amplifying bipolar transistor 3, the diode between the base and emitter thereof is brought to an off state, so that the base potential becomes equal to an emitter potential, i.e., a ground potential. The base potential is brought to the ground potential during the period in which the input voltage exceeds the difference between the bias voltage VB and the on voltage Vth of the diode between the base and emitter of the amplifying bipolar transistor 3, whereas the base potential becomes the original value (value at the linear operation) VBES during a period other than the above period. Thus, the average or mean base potential in one cycle of the input voltage is lowered by a value corresponding to the period in which the base-emitter diode is in the off state. Assuming that the base potential at the time that this non-linear operation is produced, is defined as VBEL, VBEL is given as VBEL<VBES.

Since the voltage VB of the constant voltage source 4b is set so as to satisfy VB<VBES with respect to the base potential VBES at the linear operation, the base potential VBES is higher than the potential VB of the constant voltage source 4b upon the linear operation of the amplifying bipolar transistor 3, and hence no current flows from the constant voltage source 4a to the base terminal. On the other hand, since the base potential VBEL at the non-linear operation is set as VBEL<VBES with respect to the value VBES at the linear operation upon the non-linear operation of the amplifying bipolar transistor 3, the current flows from the constant voltage source 4a to the base terminal during the period in which the base potential VBEL at the non-linear operation falls into VBEL<VB with respect to the voltage VB of the constant voltage source 4b.

Thus, when the power of the high frequency signal input to the input terminal 1 is sufficiently low, i.e., upon the linear operation of the amplifying bipolar transistor 3, the DC bias to the base terminal of the transistor is mainly supplied from the constant current source 5. When the power of the high frequency signal input to the input terminal 1 is high, i.e., upon the non-linear operation of the amplifying bipolar transistor 3, the DC bias is mainly supplied from the constant voltage source 4b. Thus, effects similar to the embodiments 1 and 2 can be obtained. By changing the voltage VB of the constant voltage source 4b, a threshold value for starting the supply of the bias from the constant voltage source 4b to the base terminal can be changed.

Embodiment 4

Figure 6:
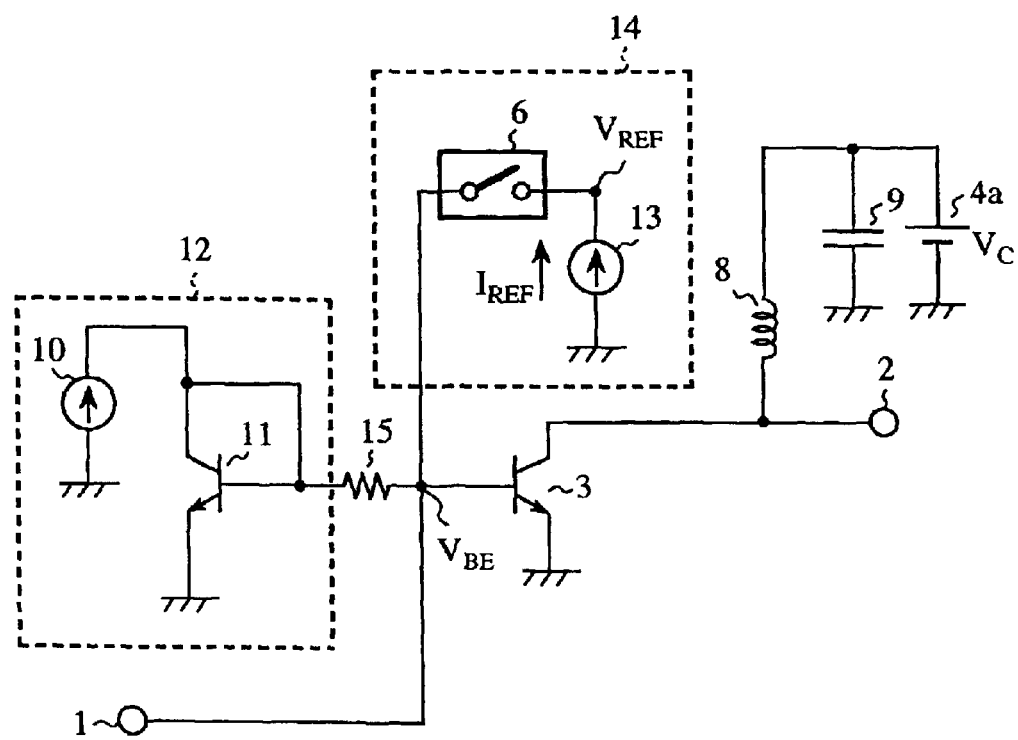
FIG. 6 is a circuit diagram to illustrate a high frequency amplifier which is an embodiment 4 of the present invention.

FIG. 6 shows a high frequency amplifier according to an embodiment 4 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4a indicates a constant voltage source, reference numeral 6 indicates a connecting unit driven by a base potential VBE of the amplifying bipolar transistor 3, reference numeral 8 indicates a bias feed inductor for supplying a DC bias to a collector terminal of the amplifying bipolar transistor 3 by the constant voltage source 4a, reference numeral 9 indicates a bypass capacitor for short-circuiting the high frequency signal, reference numeral 10 indicates a constant current source for a current mirror, reference numeral 11 indicates a bypass bipolar transistor, reference numeral 12 indicates a current mirror bias circuit which comprises the bias bipolar transistor 11 and the constant current source 10, reference numeral 13 indicates a base current compensating constant current source for generating a current of IREF, reference numeral 14 indicates a base bias compensating circuit which comprises the base current compensating constant current source 13 and the connecting unit 6, reference numeral 15 indicates a bias feed resistor connected between the amplifying bipolar transistor 3 and the current mirror bias circuit 12, respectively.

The high frequency amplifier according to the embodiment 4 is of a high frequency amplifier which makes use of the common emitter amplifying bipolar transistor 3 and allows the current mirror bias circuit 12 to supply a DC bias to a base terminal of the bipolar transistor, in that at the base terminal of the amplifying bipolar transistor 3, the base bias compensating circuit 14 is provided which comprises the connecting unit 6 by the base potential and the base current compensating constant current source 13 driven and in which one terminal of the connecting unit 6 is connected to the base terminal of the amplifying bipolar transistor 3, and the other terminal thereof is connected to the base current compensating constant current source 13.

The operation will next be described.

The high frequency amplifier according to the embodiment 4 is one for amplifying the high frequency signal input from the input terminal 1 by the amplifying bipolar transistor 3 and taking out it from the output terminal 2. In order to operate the amplifying bipolar transistor 3, there is a need to supply the DC bias to the collector terminal and the base terminal of the amplifying bipolar transistor 3. The collector terminal of the amplifying bipolar transistor 3 is supplied with a DC bias voltage from the constant voltage source 4a via the bias feed inductor 8. The base terminal of the amplifying bipolar transistor 3 is supplied with a DC bias from the current mirror bias circuit 12. When a potential VREF at a terminal connected to the base current compensating constant current source 13 is increased by an on voltage VSWON or higher with respect to the potential VBE at the terminal connected to the base of the amplifying bipolar transistor 3, i.e., when the condition VSWON<VREF−VBE, the connecting unit 6 is brought to a conducting state. When other than it, the connecting unit 6 is brought to a non-conducting state.

Here, VSWON and VREF are set such that a condition VSWON<VREF−VBES is established, i.e., the connecting unit 6 is turned off with respect to the on voltage VSWON of the switch at the base potential VBES when the power of the high frequency signal input to the input terminal 1 is sufficiently low, i.e., at the linear operation of the amplifying bipolar transistor 3. Consequently, the DC bias is mainly supplied to the base terminal from the current mirror bias circuit 12.

On the other hand, as the high frequency input power input to the input terminal 1 increases, the base potential of the amplifying bipolar transistor 3 decreases and the base current of the amplifying bipolar transistor 3 increases as described in the embodiment 3. VSWON and VREF are set such that the condition VSWON<VREF−VBEL is established with respect to the base potential VBEL at this time (upon non-linear operation), i.e., the connecting unit 6 is turned on. Consequently, the current flows out from the base bias compensating circuit 14 to the base terminal of the amplifying bipolar transistor 3, and the amount of an increase in base current supplied from the current mirror bias circuit 12 can be relaxed.

Therefore, the high frequency amplifier, which relaxes the drop in base potential of the amplifying bipolar transistor 3 with the input of the bulk power high frequency signal and provides a high saturation characteristic, can be obtained. Incidentally, while the high frequency amplifier according to the embodiment 4 is capable of obtaining a similar effect even in the absence of the bias feed resistor 15, the presence of the bias feed resistor rather than the absence thereof brings about a larger effect because the drop in base potential by the resistor is added.

Embodiment 5

Figure 7:
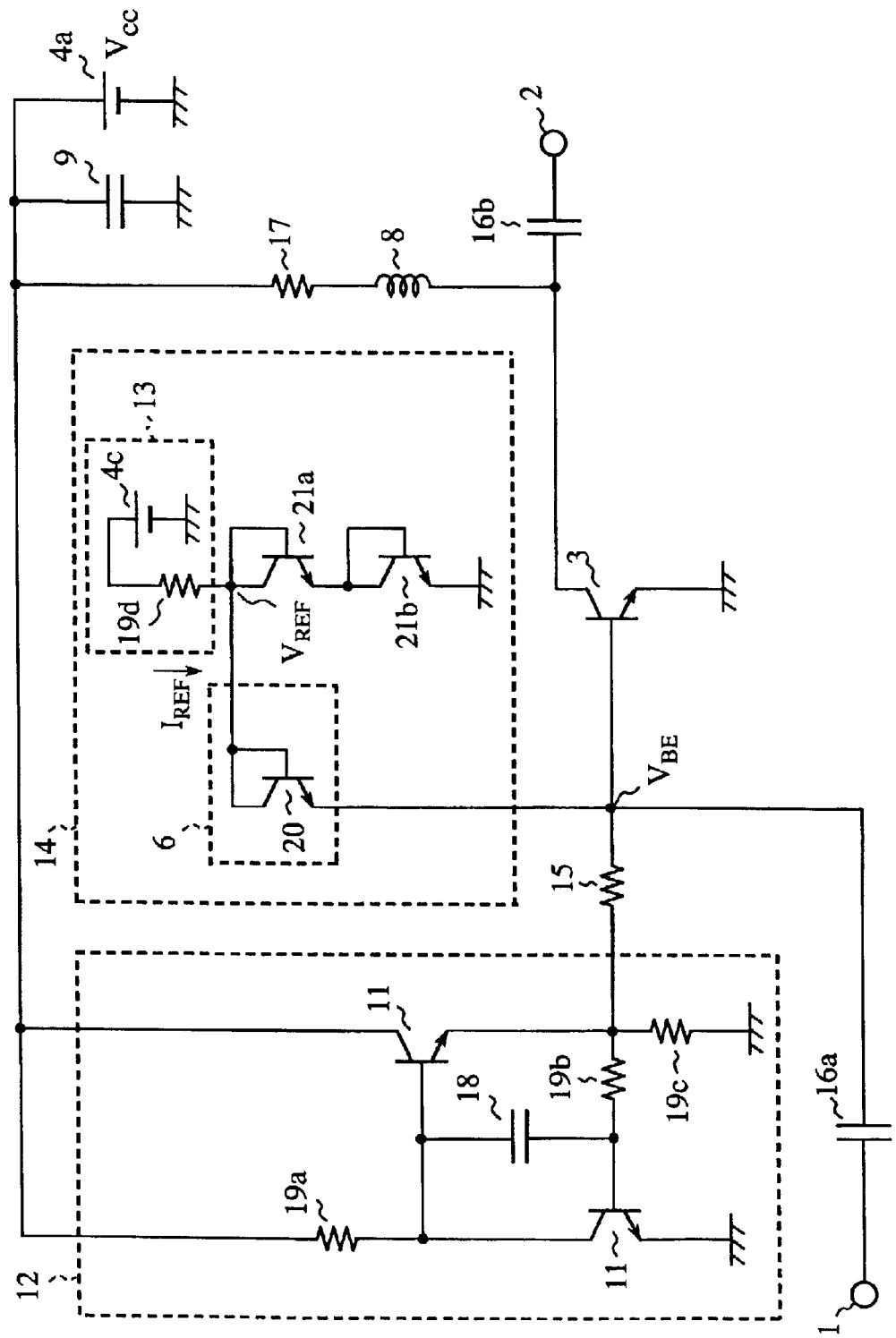
FIG. 7 is a circuit diagram to show a high frequency amplifier which is an embodiment 5 of the present invention.

FIG. 7 is a circuit diagram to show an embodiment 5 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4a indicates a constant voltage source, reference numeral 4c indicates a base current compensating constant voltage source, reference numeral 6 indicates a connecting unit driven by a base potential VBE of the amplifying bipolar transistor 3, reference numeral 8 indicates a bias feed inductor for supplying a DC bias to a collector terminal of the amplifying bipolar transistor 3 by the constant voltage source 4a, reference numeral 9 indicates a bypass capacitor for short-circuiting the high frequency signal, reference numeral 11 indicates a bias bipolar transistor, reference numeral 12 indicates a current mirror bias circuit, reference numeral 13 indicates a constant current source, reference numeral 14 indicates a base bias compensating circuit, reference numeral 15 indicates a bias feed resistor for supplying a DC bias to a base terminal of the amplifying bipolar transistor 3 by the current mirror bias circuit 12, reference numeral 16 indicates a DC cut capacitor, reference numeral 17 indicates a stabilization resistor, reference numeral 18 indicates an oscillation preventive capacitor, reference numerals 19 indicate bias resistors, reference numeral 20 indicates a switch bipolar transistor which constitutes the connecting unit 6, and reference numeral 21 indicates a reference voltage bipolar transistor for determining a reference potential VREF for the connecting unit 6, respectively. Incidentally, while the constant current source 13 is made up of a bias resistor 19d and the base current compensating constant voltage source 4c here, another configuration may be adopted if a circuit for generating a constant current similar to it is used. Further, the constant voltage source 4a and the base current compensating constant voltage source 4c may be made common.

A configuration will next be explained.

The high frequency amplifier according to the embodiment 5 is of a high frequency amplifier which makes use of the common emitter amplifying bipolar transistor 3 and allows the current mirror bias circuit 12 to supply a DC bias to a base terminal of the amplifying bipolar transistor 3, in that at the base terminal of the amplifying bipolar transistor 3, the base bias compensating circuit 14 is provided which comprises the connecting unit 6 driven by the base potential and the constant current source 13 and in which one terminal of the switch is connected to the base terminal of the amplifying bipolar transistor 3, and the other terminal thereof is connected to the constant current source 13. The constant current source 13 which constitutes the base bias compensating circuit 14, is implemented by the bias resistor 19d and the constant voltage source 4c. The connecting unit 6 is used as a diode switch 20 in that a base terminal and a collector terminal of the switch bipolar transistor 20 are short-circuit connected. An emitter terminal of the diode switch 20 is connected to its corresponding base terminal of the common emitter amplifying bipolar transistor, and the collector/base terminals thereof are connected to the bias resistor 19d. The reference voltage VRBF of the diode switch 20 is supplied from series-connected diode switches 21a and 21b more than at least one.

The operation of the base bias compensating circuit 14 will be described below. The switch bipolar transistor 20 is configured as the diode switch 6 whose base terminal and collector terminals are short-circuit connected. Such a diode switch 6 is turned on/off by the difference in potential between the emitter terminal and the base/collector terminal. When it is turned on, a current flows between the collector and emitter thereof, whereas when it is turned off, no current ideally flows. Assuming that an on voltage of the diode switch 6 is defined as VSWON, a potential at the base/collector terminal connected to the constant current source 13 is defined as VREF, and a potential at the emitter terminal connected to the base of the amplifying bipolar transistor 3 is defined as VBE, the diode switch 6 is brought to a conducting state where VSWON<VREF−VBE, and brought to a non-conducting state in other cases.

When the diode switch 6 is turned off, a current IREF that flows through the bias resistor 19d, which is generated by the base current compensating constant voltage source 4c, flows into the two reference voltage bipolar transistors 21a and 21b whose base terminal and collector terminals are respectively short-circuit connected. Owing to the current IREF, a voltage of VREF is developed at the base/collector terminal of the reference voltage bipolar transistor 21a. When the diode switch 6 is turned off, i.e., the condition VSWON>VREF−VBE with respect to the base potential VBE of the amplifying bipolar transistor 3, no current flows from the base bias compensating circuit 14 to the base terminal of the amplifying bipolar transistor 3. On the other hand, when the diode switch 6 is on, i.e., VSWON<VREF−VBE, the current flows out between the collector and emitter of the switch bipolar transistor 20 and is supplied to the base terminal of the amplifying bipolar transistor 3 as a DC bias.

VSWON and VREF are set such that the condition VSWON>VREF−VBES is established and the diode switch 6 is turned off with respect to the on voltage VSWON of the diode switch 6 at the base potential VBES when the high frequency signal power input to the input terminal 1 is sufficiently low, i.e., at the linear operation of the amplifying bipolar transistor 3. Consequently, the DC bias is mainly supplied to the base terminal from the current mirror bias circuit 12.

On the other hand, as the high frequency signal power input to the input terminal 1 increases, the base current of the amplifying bipolar transistor 3 increases, and a drop in base potential is developed as described in the embodiment 3. With this, the bias current supplied from the current mirror bias circuit 12 increases. Therefore, the base potential of the amplifying bipolar transistor 3 further drops due to the development of a voltage drop across the bias feed resistor 15. When the condition VSWON<VREF−VBEL is established with respect to the base potential VBEL at this time, the diode switch 6 is turned on, so that the current flows from the base bias compensating circuit 14 to the base terminal of the amplifying bipolar transistor 3. Thus, the amount of an increase in base bias current supplied from the current mirror bias circuit 12 can be relaxed.

Therefore, the high frequency amplifier, which relaxes the drop in base potential of the amplifying bipolar transistor 3 with the input of the bulk power high frequency signal and provides a high saturation characteristic, can be obtained. Incidentally, IREF, VREF and VSWON of the base bias compensating circuit in the high frequency amplifier according to the embodiment 5 can be arbitrarily set according to the resistance value of the bias resistor 19d, the size of each reference voltage bipolar transistor 21 and the size of the switch bipolar transistor 20.

While the number of the reference voltage bipolar transistors 21 is provided as two in the present embodiment, more than at least one may be provided as long as a desired VREF is obtained. Incidentally, while the high frequency amplifier according to the embodiment 5 can obtain a similar effect even in the absence of the bias feed resistor 15, the presence of such a bias feed resistor 15 rather than its absence brings about a greater effect because the drop in base potential by the resistor is added.

Embodiment 6

Figure 8:
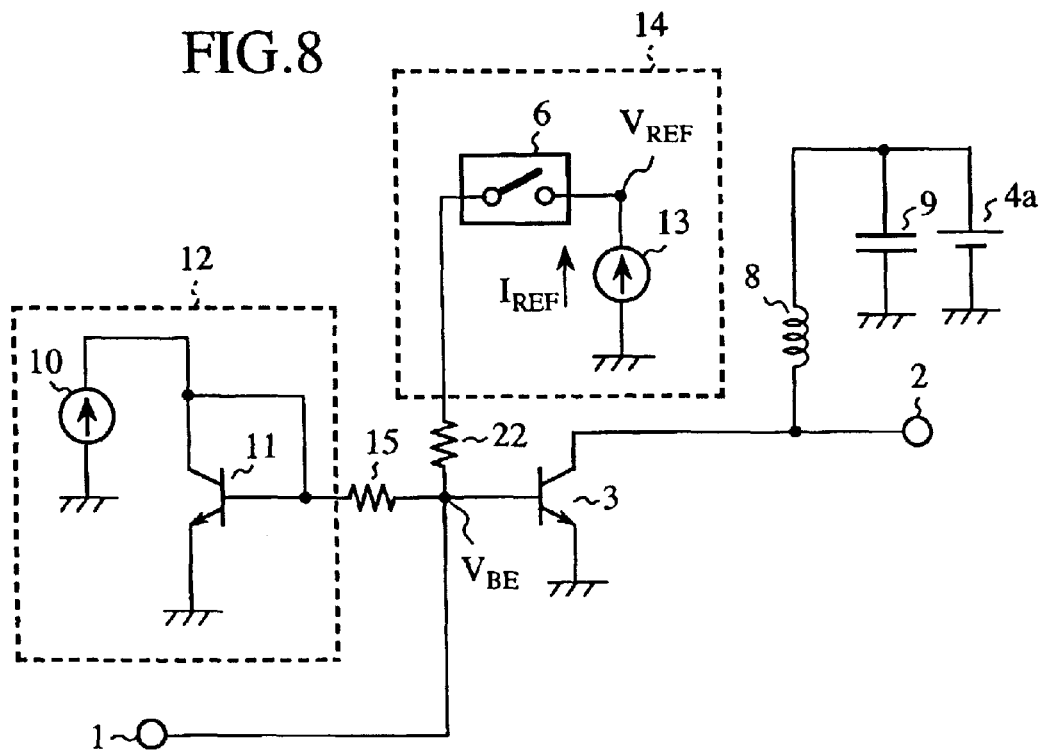
FIG. 8 is a circuit diagram to depict a high frequency amplifier which is an embodiment 6 of the present invention.

FIG. 8 shows a high frequency amplifier illustrative of an embodiment 6 of the present invention. The present embodiment is one in that in the high frequency amplifier according to the embodiment 4, a base compensating resistor 22 is inserted between the base terminal of the amplifying bipolar transistor 3 and the base compensating circuit 14.

A configuration will next be described.

The high frequency amplifier according to the embodiment 6 is of a high frequency amplifier which makes use of the common emitter amplifying bipolar transistor 3 and allows a current mirror bias circuit 12 to supply a DC bias to a base terminal of the amplifying bipolar transistor 3, in that at the base terminal of the amplifying bipolar transistor 3, the base bias compensating circuit 14 is provided which comprises a connecting unit 6 driven by a base potential and a base current compensating constant current source 13 and in which one terminal of the connecting unit 6 is connected to the base terminal of the amplifying bipolar transistor 3, and the other terminal thereof is connected to the base current compensating constant current source 13, and the base bias compensating circuit 14 is connected to the base terminal of the common emitter amplifying bipolar transistor 3 via the base compensating resistor 22.

Thus, the impedance of the base bias compensating circuit 14 as viewed from the base terminal increases, and degradation of a noise figure of the high frequency amplifier can be suppressed.

Embodiment 7

Figure 9:
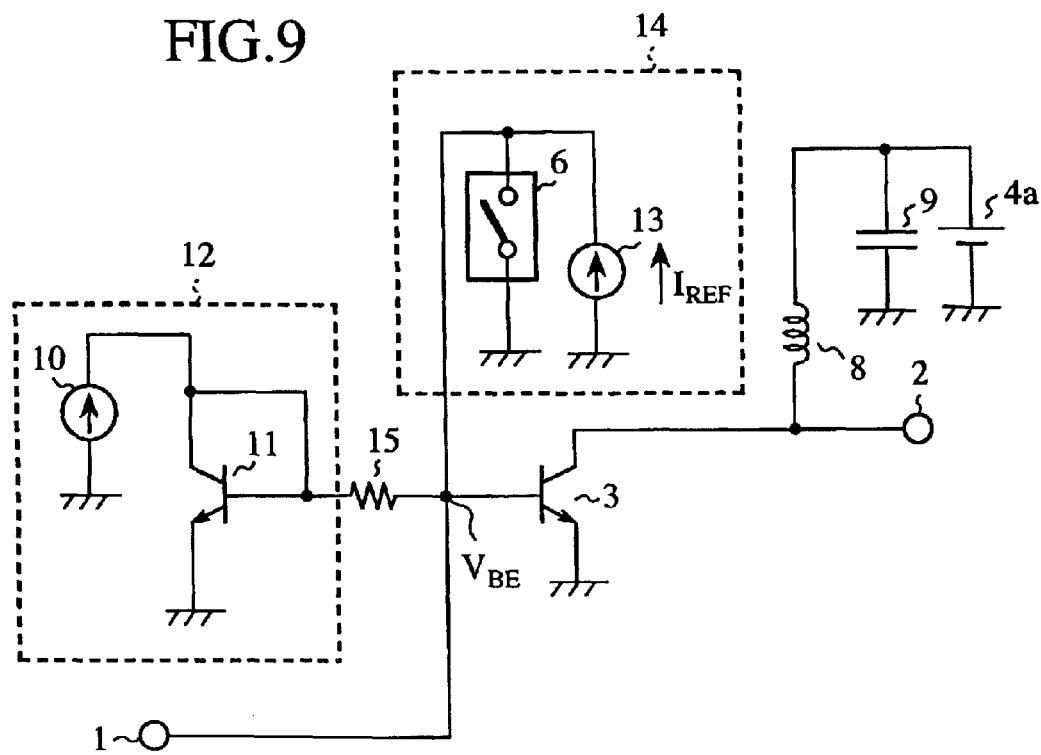
FIG. 9 is a circuit diagram to illustrate a high frequency amplifier which is an embodiment 7 of the present invention.

FIG. 9 shows a high frequency amplifier illustrative of an embodiment 7 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4a indicates a constant voltage source, reference numeral 6 indicates a connecting unit driven by a base potential VBE of the amplifying bipolar transistor 3, reference numeral 8 indicates a bias feed inductor for supplying a DC bias to a collector terminal of the amplifying bipolar transistor 3 by the constant voltage source 4a, reference numeral 9 indicates a bypass capacitor for short-circuiting the high frequency signal, reference numeral 10 indicates a constant current source for a current mirror, reference numeral 11 indicates a bias bipolar transistor, reference numeral 12 indicates a current mirror bias circuit which comprises the bias bipolar transistor 11 and the constant current source 10 for the current mirror, reference numeral 13 indicates a base current compensating constant current source for generating a current of IREF, reference numeral 14 indicates a base bias compensating circuit which comprises the base current compensating constant current source 13 and the connecting unit 6, and reference numeral 15 indicates a bias feed resistor connected between the amplifying bipolar transistor 3 and the current mirror bias circuit 12, respectively.

A configuration will next be explained.

The high frequency amplifier according to the embodiment 7 is of a high frequency amplifier which makes use of the common emitter amplifying bipolar transistor 3 and allows the current mirror bias circuit 12 to supply a DC bias voltage to a base terminal of the amplifying bipolar transistor 3 via the bias feed resistor 15, in that at the base terminal of the amplifying bipolar transistor 3, the base bias compensating circuit 14 is provided which comprises the connecting unit 6 driven by a base potential and the base current compensating constant current source 13 and in which one terminal of the switch is connected to the base terminal of the amplifying bipolar transistor 3 and the base current compensating constant current source 13, and the other terminal thereof is grounded.

The operation will next be described.

The high frequency amplifier according to the embodiment 7 is one for amplifying the high frequency signal input from the input terminal 1 by the amplifying bipolar transistor 3 and taking out it from the output terminal 2. In order to operate the amplifying bipolar transistor 3, there is a need to supply the DC bias to the collector terminal and the base terminal of the amplifying bipolar transistor 3. The collector terminal of the amplifying bipolar transistor 3 is supplied with a DC bias from the constant voltage source 4a via the bias feed inductor 8. The base terminal of the amplifying bipolar transistor 3 is supplied with a DC bias from the current mirror bias circuit 12 via the bias feed resistor 15. Assuming that the potential at the terminal connected to the base terminal of the amplifying bipolar transistor 3 and the base current compensating constant current source 13 is given as VBE and an on voltage is given as VSWON, the connecting unit 6 is brought into conduction when VBE>VSWON, whereas the connecting unit 6 is brought into non-conduction in other cases.

Here, VSWON is set such that the condition VSWON<VBES is established, i.e., the connecting unit 6 is turned on with respect to the on voltage VSWON of the connecting unit 6 at the base potential VBES when the high frequency signal power input to the input terminal 1 is sufficiently low, i.e., at the linear operation of the amplifying bipolar transistor 3. Consequently, the current IREF generated by the base current compensating constant current source 13 flows into the ground via the connecting unit 6, and the DC bias is mainly supplied to the base terminal from the current mirror bias circuit 12.

On the other hand, as the high frequency signal power input to the input terminal 1 increases, the base current of the amplifying bipolar transistor 3 increases and the base potential of the amplifying bipolar transistor 3 drops as described in the embodiment 3. When the condition VSWON>VBEL is established with respect to the base potential VBEL at this time, the connecting unit 6 is turned off so that the current flows into the base terminal of the amplifying bipolar transistor 3 from the base bias compensating circuit 14. Therefore, the amount of an increase in base current supplied from the current mirror bias circuit 12 can be relaxed.

Therefore, the high frequency amplifier, which relaxes the drop in base potential of the amplifying bipolar transistor 3 with the input of the bulk power high frequency signal and provides a high saturation characteristic, can be obtained. Incidentally, while the high frequency amplifier according to the embodiment 7 is capable of obtaining a similar effect even in the absence of the bias feed resistor 15, the presence of the bias feed resistor 15 rather than the absence thereof brings about a larger effect because the drop in base potential by the resistor is added.

Embodiment 8

Figure 10:
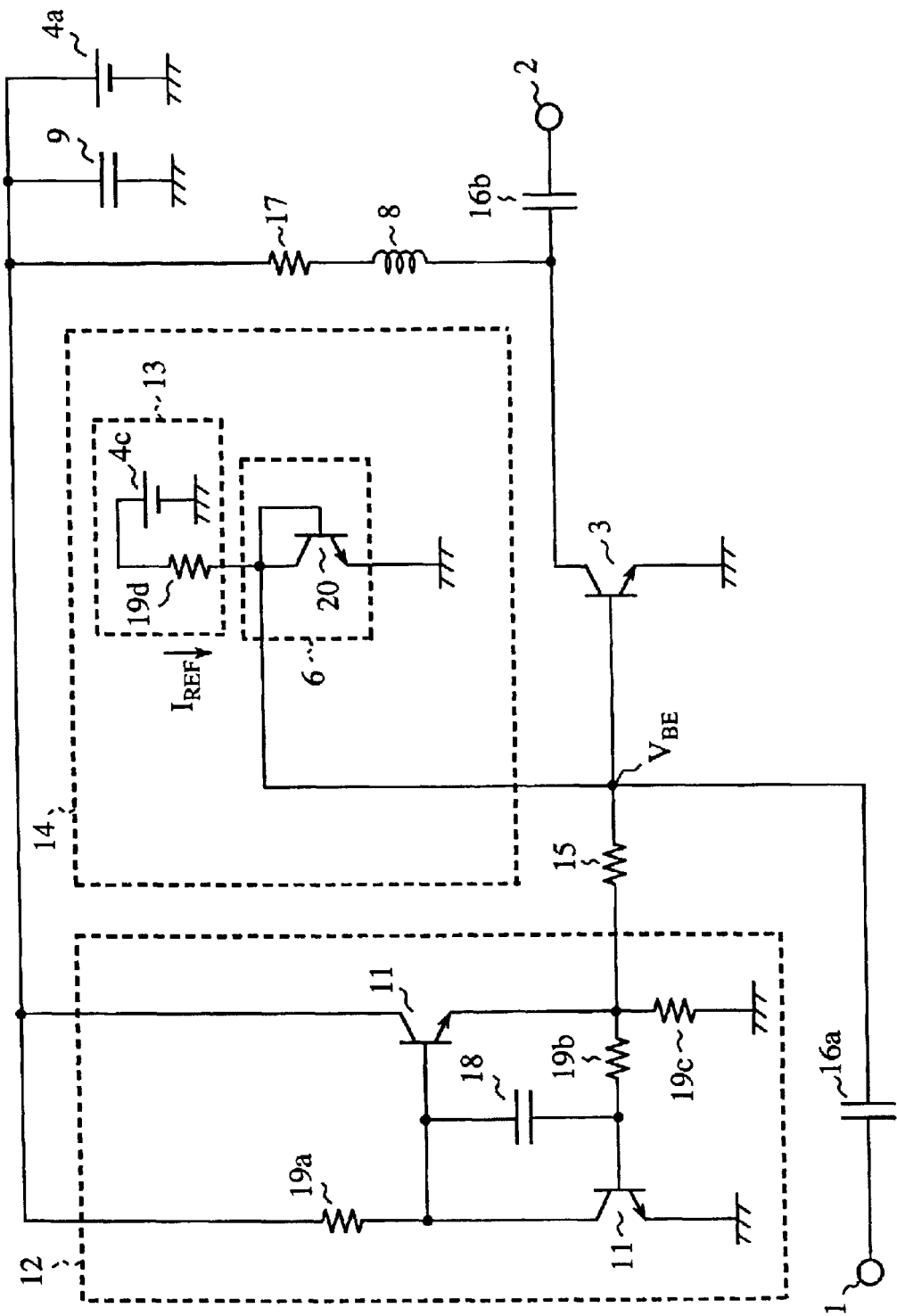
FIG. 10 is a circuit diagram to show a high frequency amplifier which is an embodiment 8 of the present invention.

FIG. 10 is a circuit diagram illustrative of an embodiment 8 of the present invention. In the drawing, reference numeral 1 indicates an input terminal for a high frequency signal, reference numeral 2 indicates an output terminal for the high frequency signal, reference numeral 3 indicates an amplifying bipolar transistor, reference numeral 4a indicates a constant voltage source, reference numeral 6 indicates a switch driven by a base potential VBE of the amplifying bipolar transistor 3, reference numeral 8 indicates a bias feed inductor for supplying a DC bias from the constant voltage source 4a to a collector terminal of the amplifying bipolar transistor 3, reference numeral 9 indicates a bypass capacitor for short-circuiting the high frequency signal, reference numeral 11 indicates a bias bipolar transistor, reference numeral 12 indicates a current mirror bias circuit, reference numeral 13 indicates a base current compensating constant current source for generating a current of IREF, reference numeral 14 indicates a base bias compensating circuit, reference numeral 15 indicates a bias feed resistor for supplying a DC bias to a base terminal of the amplifying bipolar transistor 3 by the current mirror bias circuit 12, reference numeral 16 indicates a DC cut capacitor, reference numeral 17 indicates a stabilization resistor, reference numeral 18 indicates an oscillation preventive capacitor, reference numerals 19 indicate bias resistors, and reference numeral 20 indicates a switch bipolar transistor which constitutes the switch 6, respectively.

A configuration will next be explained.

The high frequency amplifier according to the embodiment 8 is of a high frequency amplifier which makes use of the common emitter amplifying bipolar transistor 3 and allows the current mirror bias circuit 12 to supply a DC bias voltage to a base terminal of the amplifying bipolar transistor 3 via the resistor 15, in that at the base terminal of the amplifying bipolar transistor 3, the base bias compensating circuit 14 is provided which comprises the switch 6 driven by a base potential and the base current compensating constant current source 13 and in which one terminal of the switch is connected to the base terminal of the amplifying bipolar transistor 3 and the base current compensating constant current source 13, and the other terminal thereof is grounded. The base current compensating constant current source 13, which constitutes the base bias compensating circuit 14, is implemented by a bias resistor 19d and a constant voltage source 4c. The switch 6 is configured as a diode switch 20 in that the base and collector of the switch bipolar transistor 20 are short-circuit connected. The collector/base terminals of the diode switch 20 is connected to its corresponding base terminal of the common emitter amplifying bipolar transistor 3, and the emitter terminal thereof is grounded.

The operation will next be described.

The switch bipolar transistor 20 is configured as the diode switch 6 whose base terminal and collector terminals are short-circuit connected. Such a diode switch 6 is turned on/off by the difference in potential between the emitter terminal and the base/collector terminal. When it is turned on, a current flows between the collector and emitter thereof, whereas when it is turned off, no current ideally flows. Assuming that an on voltage of the diode switch 6 is defined as VSWON, and a potential at the base/collector terminal is defined as VBE, the diode switch 6 is brought into conduction where VSWON<VBE, and brought into non-conduction in other cases.

When the diode switch 6 is turned on, i.e., the condition VSWON<VBE is established with respect to the base potential VBE of the amplifying bipolar transistor 3, the current flows into the ground via between the collector and emitter of the switch bipolar transistor 20. Therefore, no current flows from the base bias compensating circuit 14 to the base terminal of the amplifying bipolar transistor 3.

On the other hand, when the diode switch 6 is turned off, i.e., the condition VSWON>VBE is established, the current IREF produced by the base bias compensating constant current source 13 flows to the base terminal of the amplifying bipolar transistor 3.

VSWON is set such that the condition VSWON<VBES is established, i.e., the diode switch 6 is turned on with respect to the on voltage VSWON of the diode switch 6 at the base potential VBES when the high frequency signal power input to the input terminal 1 is sufficiently low, i.e., at the linear operation of the amplifying bipolar transistor 3. Consequently, the DC bias is mainly supplied to the base terminal from the current mirror bias circuit 12.

On the other hand, as the high frequency signal power input to the input terminal 1 increases, the base potential of the amplifying bipolar transistor 3 drops as described in the embodiment 3. With this, a bias current supplied from the current mirror bias circuit 12 increases. Therefore, the base potential of the amplifying bipolar transistor 3 further drops since a voltage drop is developed across the bias feed resistor 15. By setting VSWON so as to satisfy VSWON>VBEL with respect to the base potential VBEL at this time, the diode switch 6 is turned off so that the current flows into the base terminal of the amplifying bipolar transistor 3 from the base bias compensating circuit 14. Therefore, the amount of an increase in base bias current supplied from the current mirror bias circuit 12 can be relaxed.

Therefore, the high frequency amplifier, which relaxes the drop in base potential of the amplifying bipolar transistor 3 with the input of the bulk power high frequency signal and provides a high saturation characteristic, can be obtained. Incidentally, while the number of the switch bipolar transistors is provided one, more than at least one may be provided as long as a desired VSWON is obtained as VSWON of the base bias compensating circuit 14 in the high frequency amplifier according to the embodiment 8. In the high frequency amplifier according to the embodiment 5, a similar effect is obtained even in the absence of the bias feed resistor 15. However, the presence of the bias feed resistor 15 rather than its absence brings about a larger effect because the drop in base potential by the resistor is added.

Embodiment 9

Figure 11:
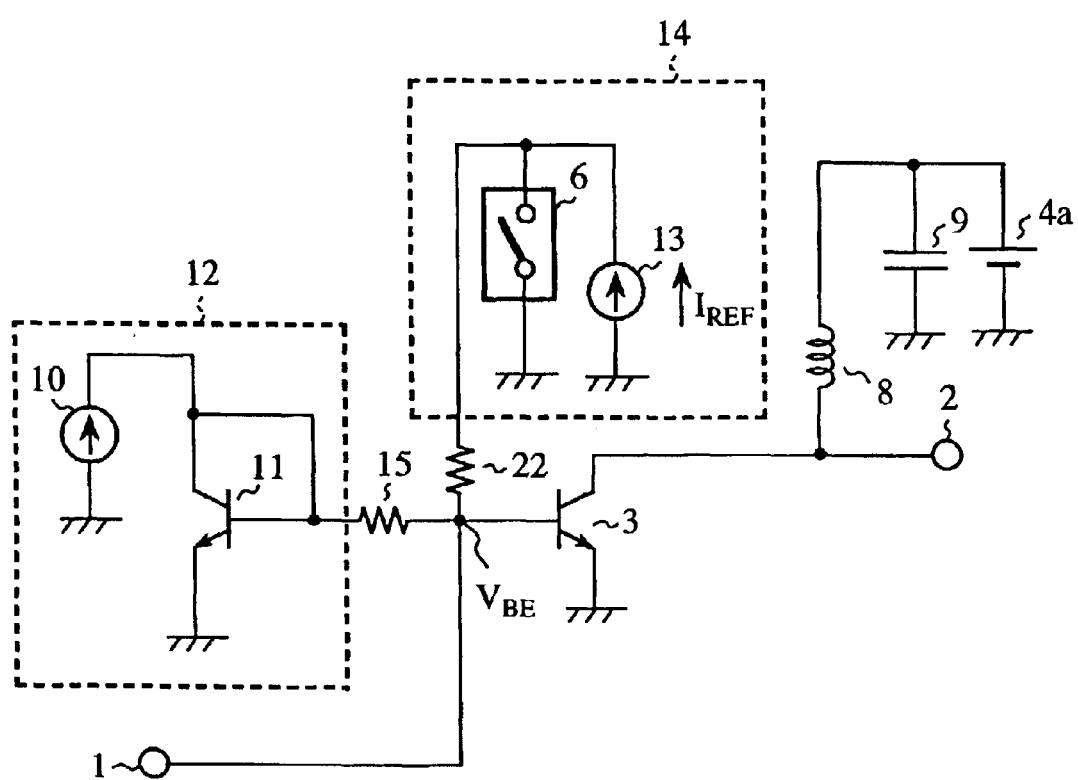
FIG. 11 is a circuit diagram to illustrate a high frequency amplifier which is an embodiment 9 of the present invention.

FIG. 11 is a diagram to show a high frequency amplifier illustrative of an embodiment 9 of the present invention. The present embodiment 9 is one in that in the high frequency amplifier according to the embodiment 7, a base compensating resistor 22 is inserted between the base terminal of the amplifying bipolar transistor 3 and the base compensating circuit 14.

A configuration will next be described.

The high frequency amplifier according to the embodiment 9 is of a high frequency amplifier which makes use of the common emitter amplifying bipolar transistor 3 and allows a current mirror bias circuit 12 to supply a DC bias voltage to a base terminal of the amplifying bipolar transistor 3 via a resistor 15, in that at the base terminal of the amplifying bipolar transistor 3, a base bias compensating circuit 14 is provided which comprises a connecting unit 6 driven by a base potential and a base current compensating constant current source 13 and in which one terminal of the switch is connected to the base terminal of the amplifying bipolar transistor 3 and the base current compensating constant current source 13, and the other terminal thereof is grounded, and the base bias compensating circuit 14 is connected to the base terminal of the common emitter amplifying bipolar transistor 3 via the base compensating resistor 22.

Since the present embodiment is similar to the embodiment 7 in operation, the description thereof will be omitted.

Owing to the embodiment 9 having such a configuration, the impedance of the base bias compensating circuit 14 as viewed from the base terminal increases and degradation of a noise figure of the high frequency amplifier can be suppressed.

Embodiment 10

Figure 12:
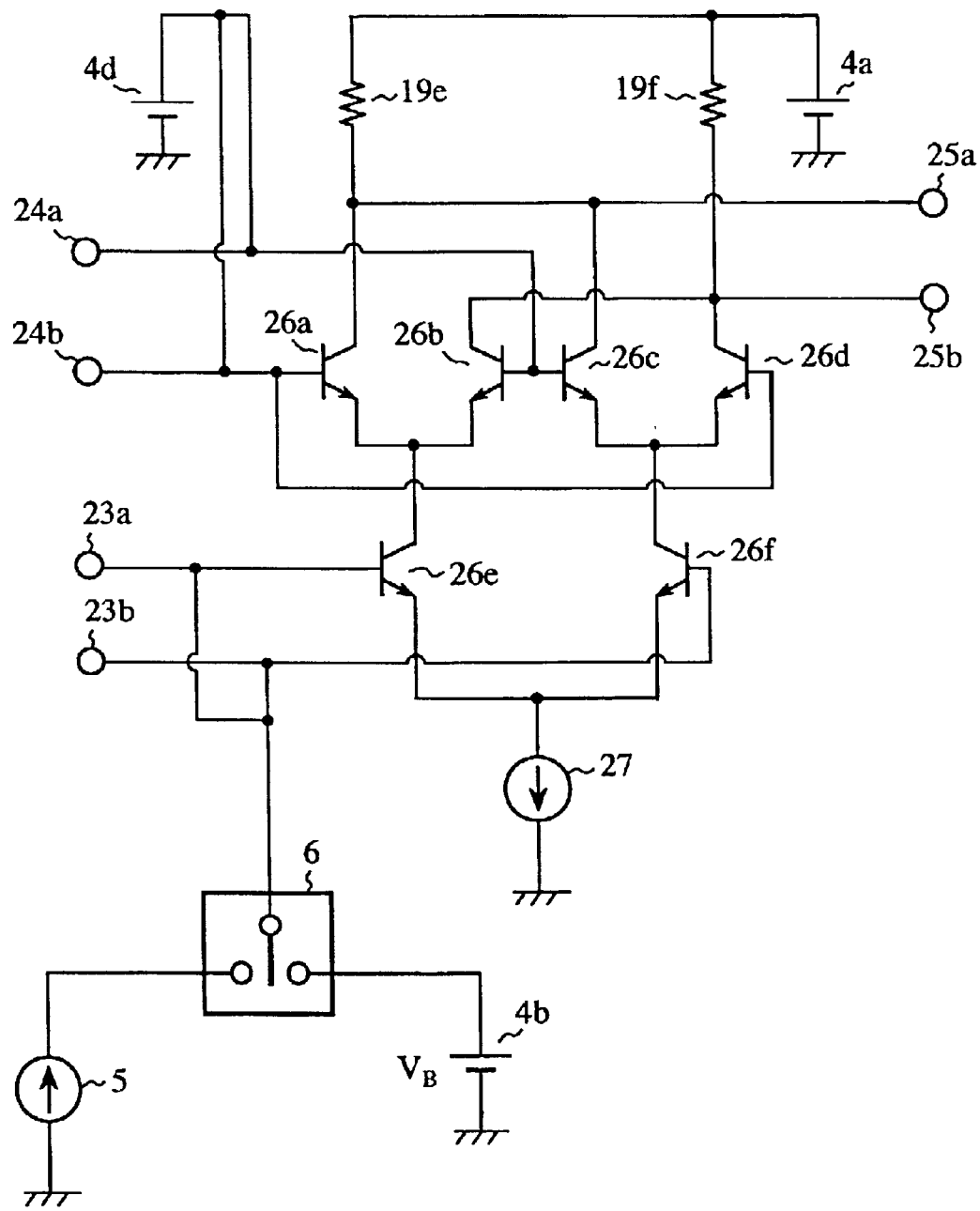
FIG. 12 is a circuit diagram to depict a high frequency amplifier which is an embodiment 10 of the present invention.

FIG. 12 is a diagram to show a frequency mixer illustrative of an embodiment 10 of the present invention. The present embodiment 10 is one in that the configuration for applying a DC bias to the base terminal of the amplifying bipolar transistor 3 in the high frequency amplifier according to the embodiment 1 is applied to frequency-mixing bipolar transistors 26e and 26f.

A configuration will next be described.

The frequency mixer according to the embodiment 10 is one in that a DC bias is applied to at least either one of bases of a bipolar transistor for the input of a high frequency signal and a bipolar transistor for the input of a local oscillation wave by using the DC bias applying configuration in the high frequency amplifier according to the embodiment 1.

Thus, a frequency mixer can be obtained which simultaneously satisfies high resistance to a change in power supply voltage and variations in the characteristic of a transistor, which is an advantage at a constant current operation, and a high saturation characteristic which is an advantage at a constant voltage operation.

Incidentally, even if the configuration for applying a DC bias to the base terminal of the amplifying bipolar transistor 3 in the high frequency amplifier according to the embodiment 1 is applied to the frequency-mixing bipolar transistors 26a through 26d, an effect similar to one obtained in the embodiment 1 can be obtained.

While the frequency mixer shown in FIG. 12 is one to which the configuration for applying a DC bias in the high frequency amplifier according to the embodiment 1 is applied, the DC bias applying configuration in the high frequency amplifier according to any one of the embodiments 2 through 9 as an alternative to the embodiment 1 may be applied.

Embodiment 11

Figure 13:
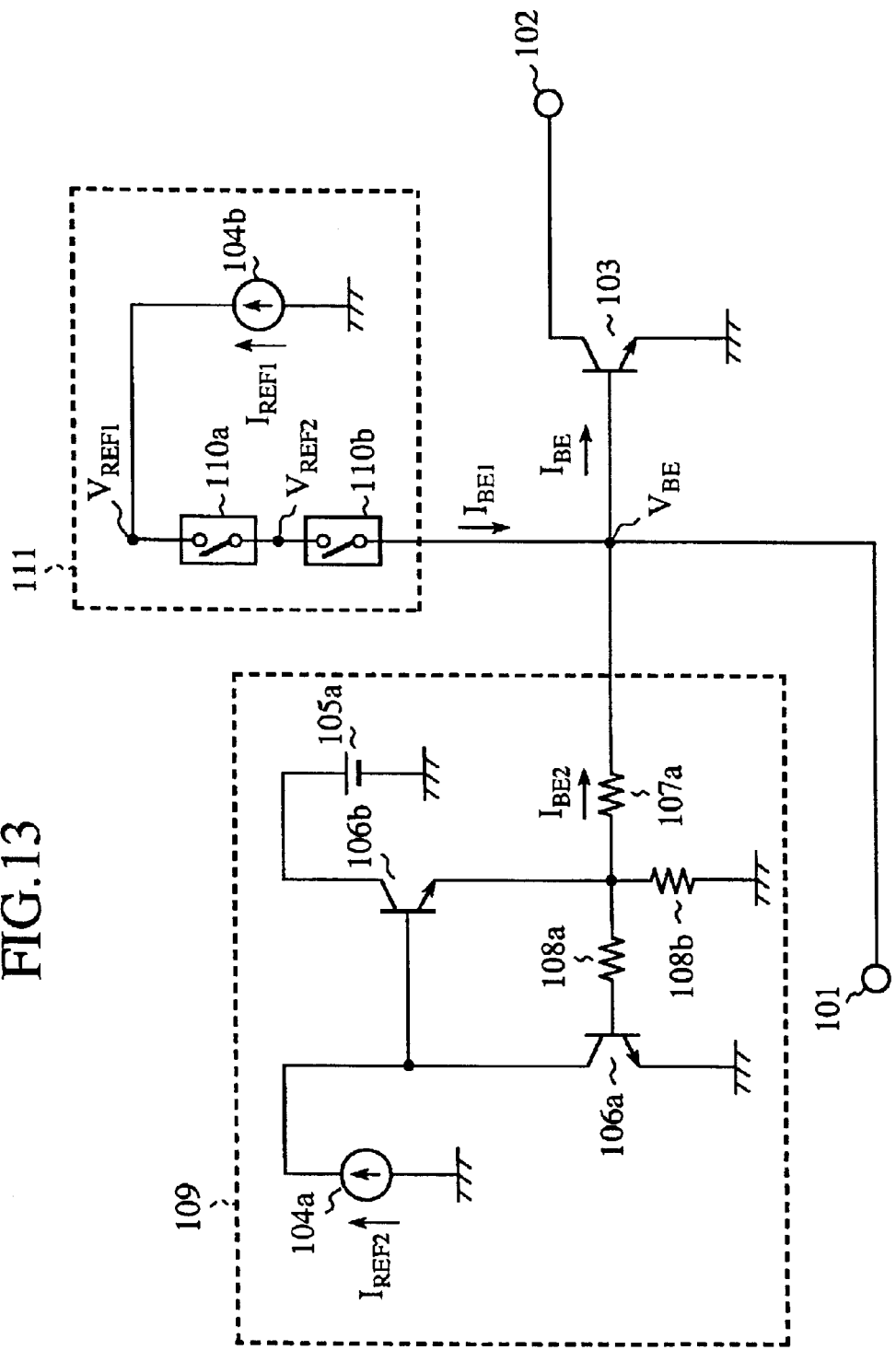
FIG. 13 is a circuit diagram to illustrate a high frequency amplifier which is an embodiment 11 of the present invention.

FIG. 13 shows a high frequency amplifier illustrative of an embodiment 11 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numerals 104a and 104b indicate constant current sources, reference numeral 105a indicates a constant voltage source, reference numerals 106a and 106b indicate bias bipolar transistors, reference numeral 107a indicates a bias feed resistor for supplying a DC bias to its corresponding base terminal of the amplifying bipolar transistor 3, reference numerals 108a and 108b indicate bias resistors, reference numeral 109 indicates a current mirror bias circuit which comprises the constant current source 104a, the constant voltage source 105a, the bias bipolar transistors 106a and 106b, the bias feed resistor 107a, and the bias resistors 108a and 108b, reference numerals 110a and 110b, indicate connecting units, and reference numeral 111 indicates a base bias compensating circuit which comprises the constant current source 104b and the connecting units 110a and 110b, respectively.

A configuration will next be described.

As shown in FIG. 13, the high frequency amplifier according to the embodiment 11 is of a high frequency amplifier which makes use of the common emitter amplifying bipolar transistor 103 and causes the current mirror bias circuit 109 to supply a DC bias to the base terminal of the amplifying bipolar transistor 103, in that the base bias compensating circuit 111 is provided which comprises the two series-connected connecting units 110a and 110b driven by a base potential VBE of the amplifying bipolar transistor 103 and the constant current source 104b, and in which one terminal of the series-connected connecting unit 110b is connected to the base terminal of the amplifying bipolar transistor 103, and one terminal of the connecting unit 110a is connected to the constant current source 104b.

The operation and an effect will be described below.

The high frequency amplifier according to the embodiment 11 is one in that the high frequency signal input to the input terminal 101 is amplified by the amplifying bipolar transistor 103 and the amplified signal is taken out from the output terminal 102. In order to operate the amplifying bipolar transistor 103, there is a need to supply a DC bias to the base terminal of the amplifying bipolar transistor 103.

When the high frequency signal power input to the input terminal 101 is sufficiently low, i.e., upon a linear operation of the amplifying bipolar transistor 103, a DC bias is mainly supplied from the current mirror bias circuit 109 to the base terminal of the amplifying bipolar transistor 103. When the high frequency signal power input to the input terminal 101 is large, i.e., upon a non-linear operation of the amplifying bipolar transistor 103, a DC bias is mainly from the base bias compensating circuit 111 to the base terminal thereof.

The operation of the base bias compensating circuit 111 will be described below.

The connecting units 110a and 110b are turned on/off by the difference in potential between their terminals. When the connecting units 110a and 110b are on, they are respectively ideally brought to a short-circuited state. When the connecting units 110a and 110b are off, they are respectively ideally brought to an open state. Now, an on voltage used for each of the connecting units 110a and 110b is defined as VSW_ON.

When the connecting units 110a and 110b are off, i.e., the condition VSW_ON>VREF2−VBE and the condition VSW_ON>VREF1−VREF2 are established at VREF1, base potential VBE of the amplifying bipolar transistor 103, and potential VREF2 between the connecting units, no current flows from the base bias compensating circuit 111 to the base terminal of the amplifying bipolar transistor 103.

On the other hand, when the connecting units 110a and 110b are turned off, i.e., the conditions VSW_ON<VREF2−VBE and VSW_ON<VREF1−VREF2 are established, a current of IREF1 flows in the connecting units 110a and 110b and is supplied to the base terminal of the amplifying bipolar transistor 103 as a DC bias.

VSW_ON VREF1 and VREF2 are set such that the conditions VSW_ON>VREF2−VBE_S and VSW_ON>VREF1−VREF2 are established, i.e., the connecting units 110a and 110b are turned off with respect to the on voltage VSW_ON for the connecting units 110a and 110b at a base potential VBE_S when the high frequency signal power input to the input terminal 101 is sufficiently low, i.e., at the linear operation of the amplifying bipolar transistor 103. Consequently, a DC bias is mainly supplied to the base terminal from the current mirror bias circuit 109.

On the other hand, as the high frequency signal power input to the input terminal 101 increases, the base current of the amplifying bipolar transistor 103 increases and a drop in base potential occurs. With this, a bias current supplied from the current mirror bias circuit 109 increases. Therefore, the base potential of the amplifying bipolar transistor 103 further drops since a voltage drop is developed across the bias feed resistor 107a.

When the conditions VSW_ON<VREF2−VBE_L and VSW_ON<VREF1−VREF2 are established with respect to the base potential VBE_L at this time, the connecting units are turned on so that the current flows from the base bias compensating circuit 111 to the base terminal of the amplifying bipolar transistor 103. Thus, the amount of an increase in base bias current supplied from the current mirror bias circuit 109 is relaxed.

Therefore, the high frequency amplifier, which relaxes the drop in base potential of the amplifying bipolar transistor 3 with the input of the bulk power high frequency signal and provides a high saturation characteristic, can be obtained. Namely, when a high frequency signal having low power is input, a constant current operation which shows low dependence on a change in power supply voltage and being good against a process variations of each transistor is achieved owing to the main supply of the DC bias from the current mirror bias circuit 109. Upon the input of a bulk power high frequency signal, a DC bias is mainly supplied from the base bias compensating circuit 111, whereby a constant voltage operation high in saturation characteristic can be implemented simultaneously with the constant current operation.

Further, since the impedance can be increased by connecting the 110a and 10b in series, degradation of a noise figure can be reduced.

Incidentally, the current mirror bias circuit 109 is configured as a circuit system using the bias bipolar transistor 106b to perform a reduction in error by the finite output resistance of the bipolar transistor in the present embodiment. However, even when another current mirror bias circuit system is used, e.g., even when a basic current mirror constant current circuit, a Weidler type current mirror constant current circuit or a Wilson type current mirror constant current circuit, or the like which eliminates the bias bipolar transistor 106b and short-circuits the collector terminal and the base terminal of the bias bipolar transistor 106a, and the base bias compensating circuit 111 employed in the embodiment 11 are utilized in combination, a similar effect can be obtained.

Embodiment 12

Figure 14:
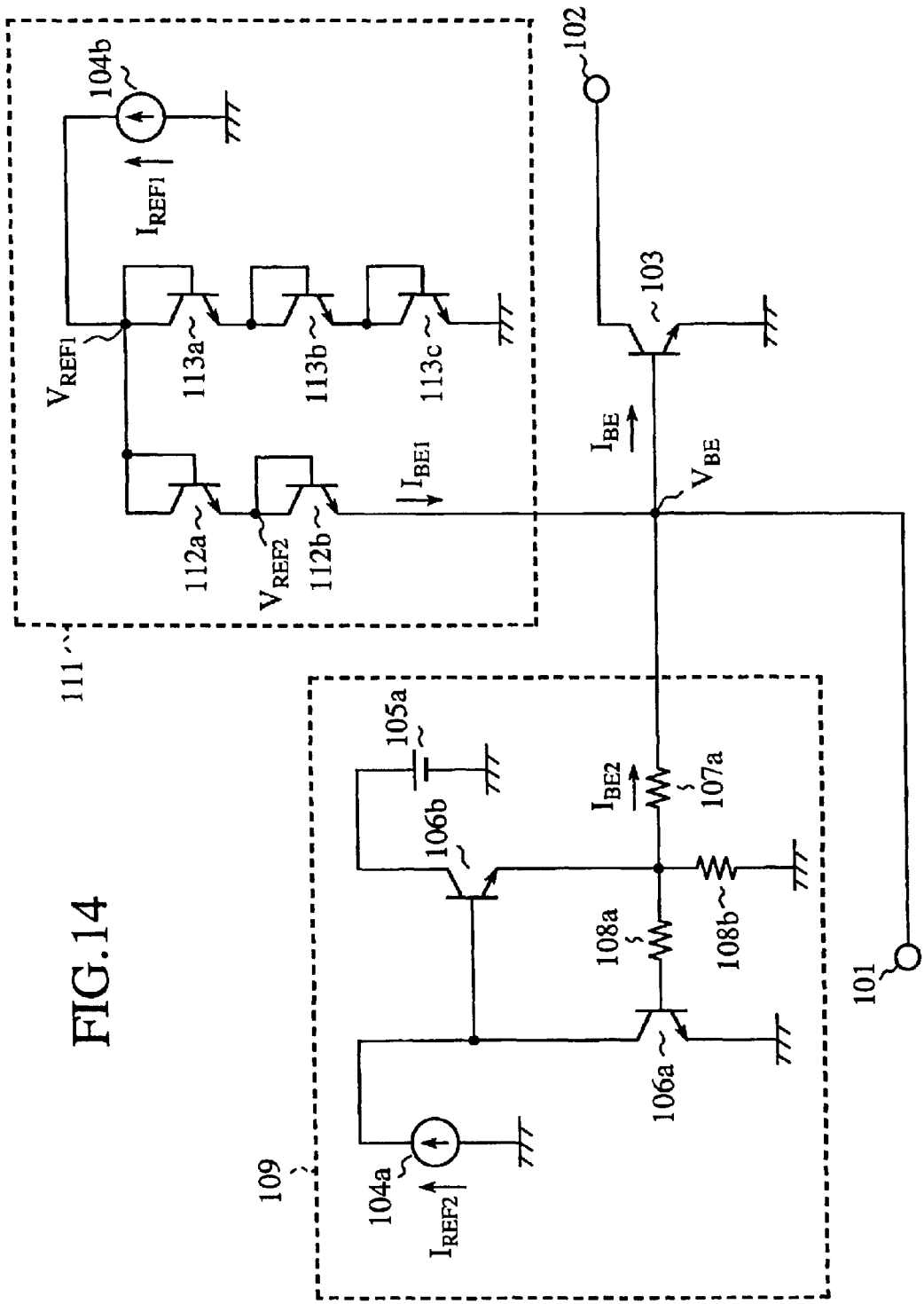
FIG. 14 is a circuit diagram to show a high frequency amplifier which is an embodiment 12 of the present invention.

FIG. 14 shows a high frequency amplifier illustrative of an embodiment 12 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numerals 104a and 104b indicate constant current sources, reference numeral 105a indicates a constant voltage source, reference numerals 106a and 106b indicate bias bipolar transistors, reference numeral 107a indicates a bias feed resistor for supplying a DC bias to its corresponding base terminal of the amplifying bipolar transistor 103, reference numerals 108a and 108b indicate bias resistors, reference numeral 109 indicates a current mirror bias circuit which comprises the constant current source 4a, the constant voltage source 105a, the bias bipolar transistors 106a and 106b, the bias feed resistor 107a, and the bias resistors 108a and 108b, reference numerals 112a and 112b indicate switch bipolar transistors, reference numerals 113a, 113b and 113c indicate reference voltage bipolar transistors, and reference numeral 111 indicates a base bias compensating circuit which comprises the constant current source 104b, the switch bipolar transistors 112a and 112b and the reference voltage bipolar transistors 113a, 113b and 113c, respectively.

A configuration will next be shown.

As shown in FIG. 14, the high frequency amplifier according to the embodiment 12 is of a high frequency amplifier which makes use of the common emitter amplifying bipolar transistor 103 and causes the current mirror bias circuit 109 to supply the DC bias to the base terminal of the amplifying bipolar transistor 103, in that the base bias compensating circuit 111 is provided which comprises the two series connected switches (switch bipolar transistors) 112a and 112b driven by a base potential VBE of the amplifying bipolar transistor 103 and the constant current source 104b, and in which one terminal of the series-connected switch is connected to the base terminal of the amplifying bipolar transistor 103, and the other terminal thereof is connected to the constant current source 104b.

The operation and an effect will be described below.

The high frequency amplifier according to the embodiment 12 is one in that the high frequency signal input to the input terminal 101 is amplified by the amplifying bipolar transistor 103 and the amplified signal is taken out from the output terminal 102. In order to operate the amplifying bipolar transistor 103, there is a need to supply a DC bias to the base terminal of the amplifying bipolar transistor 103.

When the high frequency signal power input to the input terminal 101 is sufficiently low, i.e., upon a linear operation of the amplifying bipolar transistor 103, a DC bias is mainly supplied from the current mirror bias circuit 109 to the base terminal of the amplifying bipolar transistor 103. When the high frequency signal power input to the input terminal 101 is large, i.e., upon a non-linear operation of the amplifying bipolar transistor 103, a DC bias is mainly from the base bias compensating circuit 111 to the base terminal thereof.

The operation of the base bias compensating circuit 111 will next be described.

The switch bipolar transistors 112a and 112b are diode switches whose base terminal and collector terminals are short-circuit connected. Such switches are respectively turned on/off by the differences in potential between the emitter terminals and the base/collector terminals. When each of them is turned on, a current flows between the collector and emitter thereof, whereas when it is turned off, no current ideally flows. Here, an on voltage of each switch is defined as VSW_ON.

When the diode switches are turned off, a current IREF generated from the constant current source 104b flows into the three reference voltage generating bipolar transistors 113a, 113b and 113c whose base terminal and collector terminals are short-circuit connected. Owing to the current IREF, a voltage of VREF1 is produced at a base/collector terminal of the reference voltage bipolar transistor 113a.

When the diode switches are off, i.e., the condition VSW_ON>VREF2−VBE and VSW_ON>VREF1−VREF2 are established at VREF1, a base potential VBE of the amplifying bipolar transistor 103, a base/collector terminal potential VREF1 of the switch bipolar transistor 112a, and a base/collector terminal potential VREF2 of the switch bipolar transistor 112b, no current flows from the base bias compensating circuit 111 to the base terminal of the amplifying bipolar transistor 103.

On the other hand, when the diode switches are on, i.e., the conditions VSW_ON<VREF−VBE and VSW_ON<VREF1−VREF2 are established, the current flows between the collector and emitter of each of the switch bipolar transistors 112a and 112b and is supplied to the base terminal of the amplifying bipolar transistor 103 as a DC bias.

VSW_ON, VREF1 and VREF2 are set such that the conditions VSW_ON>VREF2−VBE_S and VSW_ON>VREF1−VREF2 are established, i.e., the switches 112a and 112b are turned off with respect to the on voltage VSW_ON for the diode switches at a base potential VBE_S when the high frequency signal power input to the input terminal 101 is sufficiently low, i.e., at the linear operation of the amplifying bipolar transistor 103. Consequently, a DC bias is mainly supplied to the base terminal from the current mirror bias circuit 109.

On the other hand, as the high frequency signal power input to the input terminal 101 increases, the base current of the amplifying bipolar transistor 103 increases and a drop in base potential occurs. With this, a bias current supplied from the current mirror bias circuit 109 increases. Therefore, the base potential of the amplifying bipolar transistor 103 further drops since a voltage drop is developed across the bias feed resistor 107a.

When the conditions VSW_ON<VREF2−VBE_L and VSW_ON<VREF1−VREF2 are established with respect to the base potential VBE_L at this time, the diode switches are turned on so that the current flows from the base bias compensating circuit 111 to the base terminal of the amplifying bipolar transistor 103. Thus, the amount of an increase in base bias current supplied from the current mirror bias circuit 109 can be relaxed.

Figure 15:
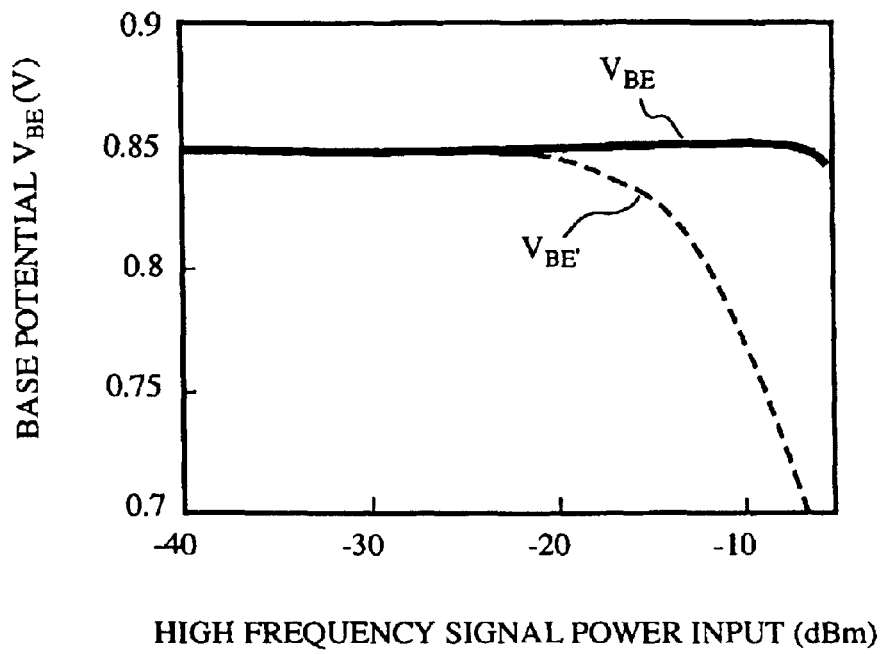
FIG. 15 is a graph to show a change in base potential when high frequency signal power input to a terminal for inputting a high frequency signal increases.
Figure 16:
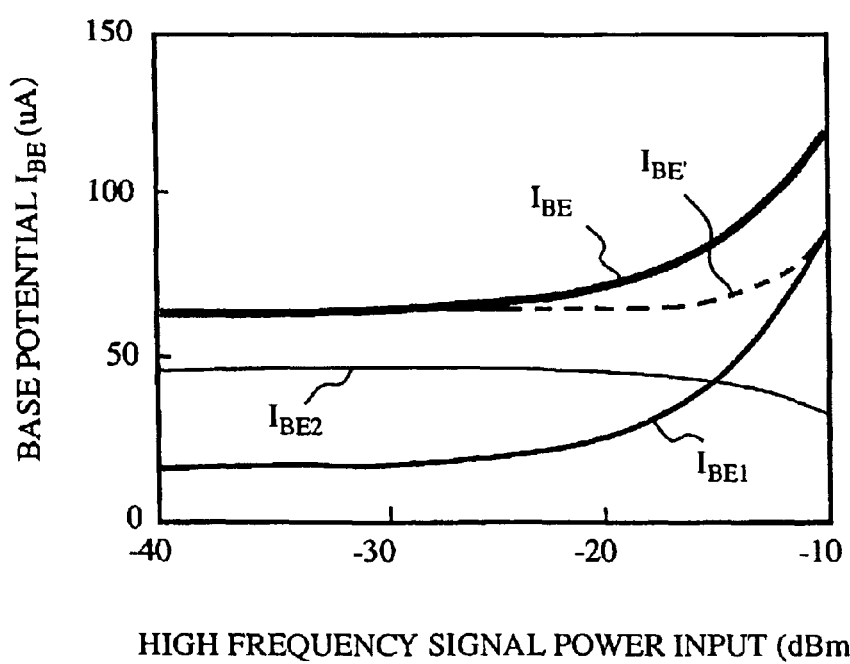
FIG. 16 is a graph to illustrate a change in base current at the time that the high frequency signal power input to the terminal for inputting the high frequency signal increases.

FIG. 15 shows a change in base potential VBE at the time when high frequency signal power input to the input terminal 1 for the high frequency signal increases, and FIG. 16 shows a change in base current IBE at the time when the high frequency signal power input to the input terminal 101 for the high frequency signal increases.

In FIGS. 15 and 16, VBE' and IBE' both show a case in which the base bias compensating circuit 111 employed in the embodiment 12 is not provided and the base DC bias of the amplifying transistor is supplied by the current mirror circuit 109 via the bias feed resistor 107a.

Thus, in the high frequency amplifier according to the embodiment 12, a high frequency amplifier can be obtained which relaxes the drop in base potential of the amplifying bipolar transistor 103 with the input of the bulk power high frequency signal and provides a high saturation characteristic.

Namely, when a high frequency signal having low power is input, a constant current operation which shows low dependence on a change in power supply voltage and being good against a process variations of each transistor is achieved owing to the main supply of the DC bias from the current mirror bias circuit 111. Upon the input of a bulk power high frequency signal, a DC bias is mainly supplied from the base bias compensating circuit 111, whereby a constant voltage operation high in saturation characteristic can be implemented simultaneously with the constant current operation. Further, since the impedance can be increased by connecting the switch bipolar transistors 112a and 112b in series, degradation of a noise figure can be reduced.

Incidentally, VREF1, VREF2 and VSW_ON of the base bias compensating circuit 111 in the high frequency amplifier according to the embodiment 12 can be arbitrarily set according to the sizes of the reference voltage bipolar transistors 113a, 113b and 113c and the sizes of the switch bipolar transistors 112a and 112b.

While the number of the reference voltage bipolar transistors is provided as three in the present embodiment, more than at least one may be provided as long as a desired VREF is obtained.

Further, the current mirror bias circuit 109 is configured here as a circuit system using the bias bipolar transistor 6b to carry out a reduction in error by the finite output resistance of the bipolar transistor. However, even when another current mirror bias circuit system is used, e.g., even when a basic current mirror constant current circuit, a Weidler type current mirror constant current circuit or a Wilson type current mirror constant current circuit, or the like which eliminates the bias bipolar transistor 106b and short-circuits the collector terminal and the base terminal of the bias bipolar transistor 106a, and the base bias compensating circuit 111 employed in the embodiment 12 are utilized in combination, a similar effect can be obtained.

Embodiment 13

Figure 17:
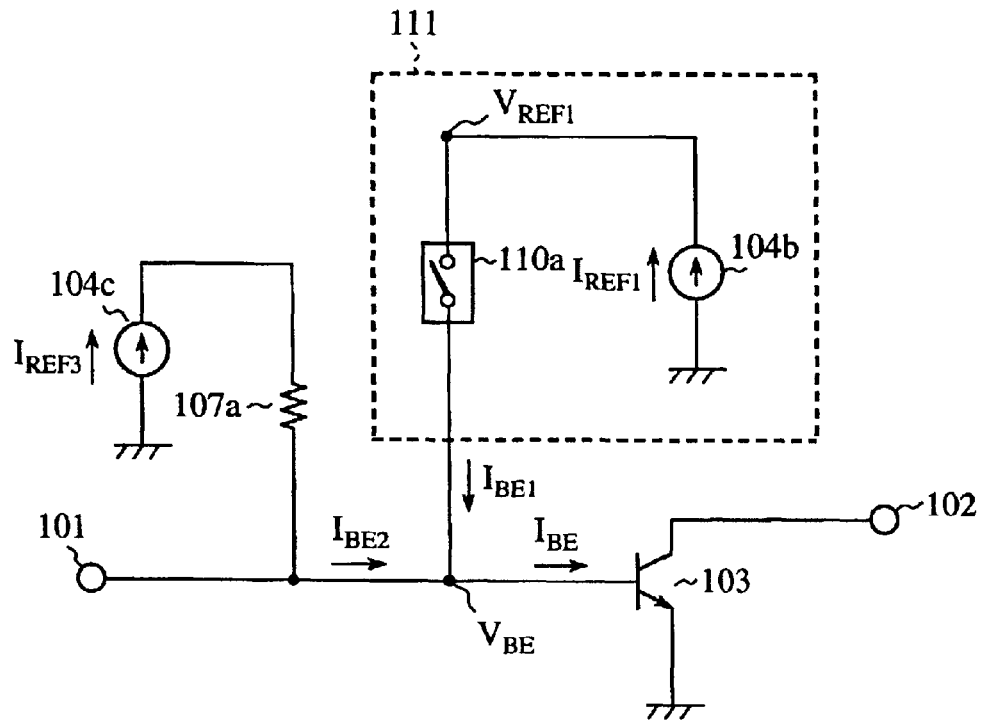
FIG. 17 is a circuit diagram to illustrate a high frequency amplifier which is an embodiment 13 of the present invention.

FIG. 17 shows a high frequency amplifier illustrative of an embodiment 13 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numerals 104b and 104c indicate constant current sources, reference numeral 107a indicates a bias feed resistor for supplying a DC bias to its corresponding base terminal of the amplifying bipolar transistor 103, reference numerals 110a and 110b indicate connecting units, and reference numeral 111 indicates a base bias compensating circuit which comprises the constant current source 104b and the connecting unit 110a, respectively.

A configuration will next be described.

As shown in FIG. 17, the high frequency amplifier according to the embodiment 13 is a high frequency amplifier which makes use of the common emitter amplifying bipolar transistor 103 and causes the constant current source 104c and bias feed resistor 107a to supply a DC bias to the base terminal of the amplifying bipolar transistor 103, in that the base bias compensating circuit 111 is provided which comprises the connecting unit 110a driven by a base potential VBE of the amplifying bipolar transistor 103 and the constant current source 104b more than at least one, and in which one terminal of the connecting unit 110a is connected to the base terminal of the amplifying bipolar transistor 103, and the other terminal thereof is connected to the constant current source 104b.

The embodiment 13 is one in that the current mirror bias circuit 109 in the high frequency amplifier according to the embodiment 11 is simply replaced by a circuit comprising the constant current source 104c and the bias feed resistor 107a. However, the base bias compensating circuit 111 is provided even when the current mirror bias circuit 109 is simply replaced by the circuit comprising the constant current source 104c and the bias feed resistor 107a. Therefore, a high frequency amplifier can be obtained which relaxes a drop in base potential of the amplifying bipolar transistor 103 with the input of the bulk power high frequency signal and provides a high saturation characteristic.

Namely, when a high frequency signal having low power is input, a constant current operation which shows low dependence on a change in power supply voltage and being good against a process variations of each transistor is achieved owing to the principal supply of the DC bias from the constant current source 104c. Upon the input of a bulk power high frequency signal, the DC bias is mainly supplied from the base bias compensating circuit 111, whereby a constant voltage operation high in saturation characteristic can be realized simultaneously with the constant current operation.

Figure 18:
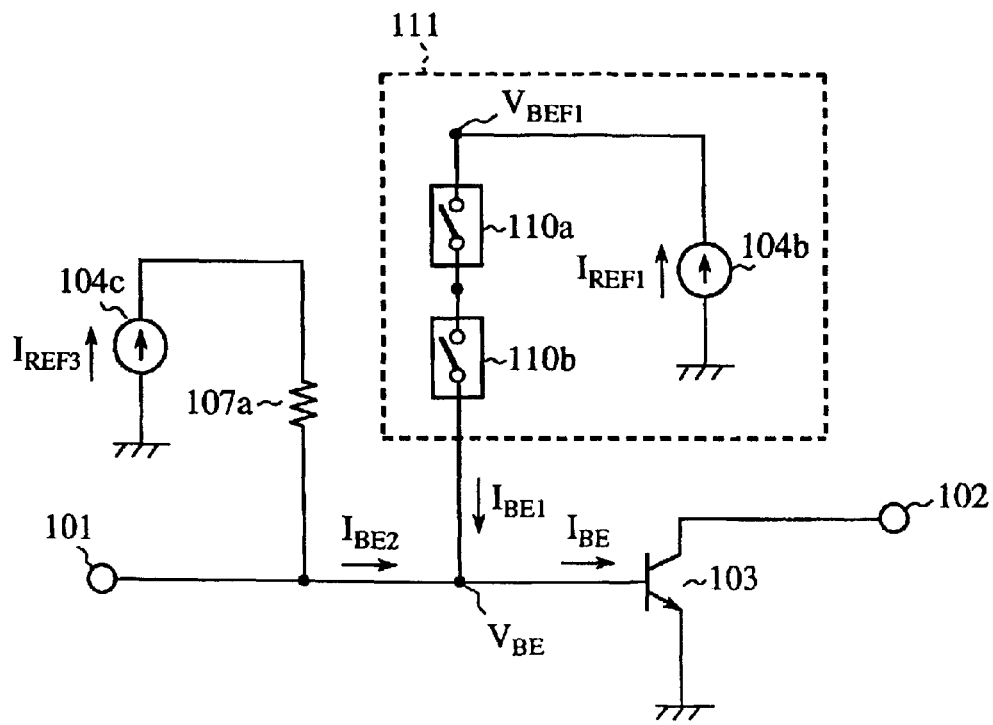
FIG. 18 is a circuit diagram to show a high frequency amplifier which is a modification of the embodiment 13 of the present invention.

FIG. 18 is a diagram to show a modified embodiment of the embodiment 13.

As shown in FIG. 18, a high frequency amplifier according to the modified embodiment of the embodiment 13 is a high frequency amplifier which makes use of a common emitter amplifying bipolar transistor 103 and causes a constant current source 104c and a bias feed resistor 107a to supply a DC bias to a base terminal of the amplifying bipolar transistor 103, in that a base bias compensating circuit 111 is provided which comprises the switches 110a and 10b driven by a base potential VBE of the amplifying bipolar transistor 103 and a current source 104b more than at least one, and in which one terminal of one of the switches is connected to the base terminal of the amplifying bipolar transistor 103, and the other terminal of the other of the switches is connected to the constant current source 104b.

An effect can also be realized in which by adding the connecting unit 110b as in the high frequency amplifier shown in FIG. 18, the impedance of the base bias compensating circuit 111 employed in the embodiment 13 is increased to make it possible to reduce degradation of a noise figure.

Figure 19:
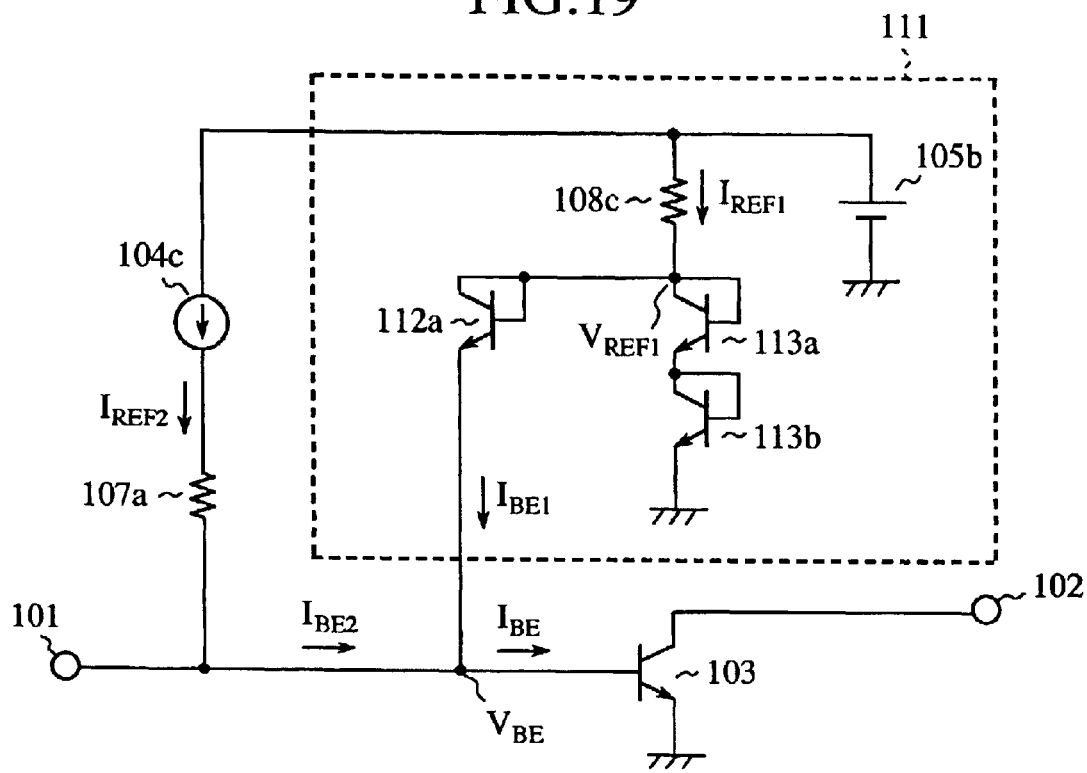
FIG. 19 is a circuit diagram to illustrate a high frequency amplifier which is a detailed form of the embodiment 13 of the present invention.
Figure 20:
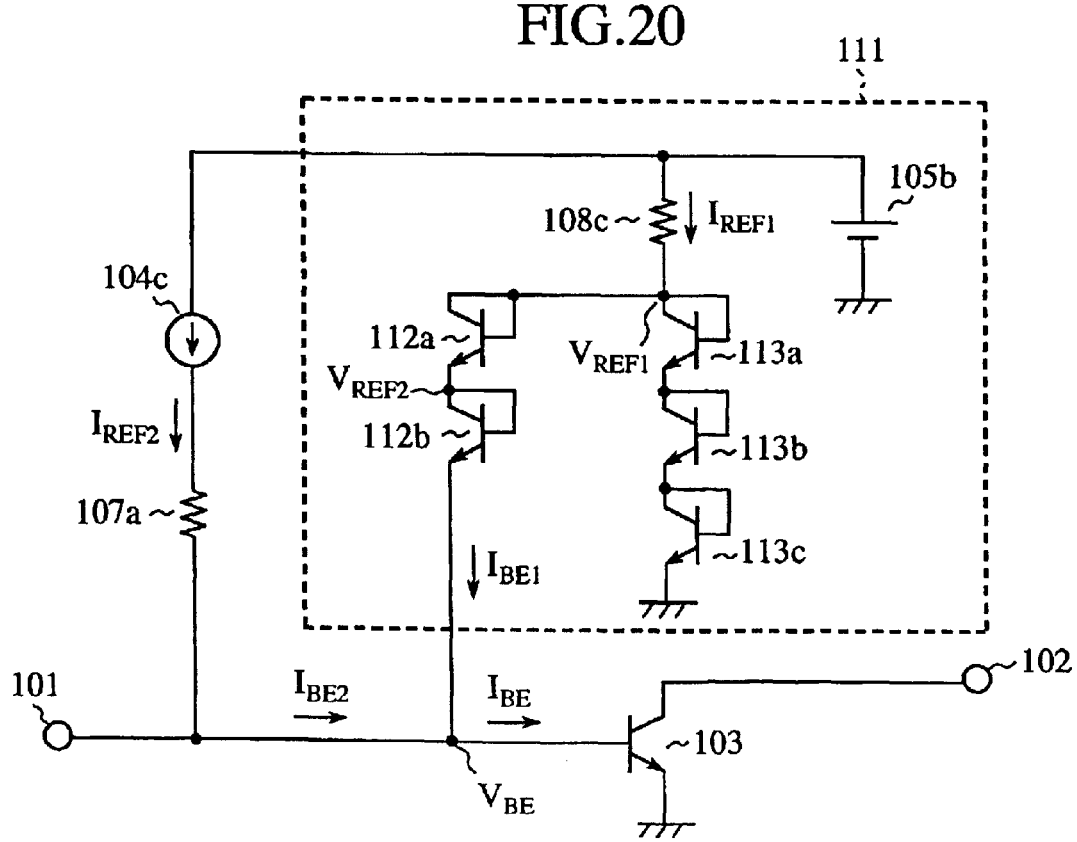
FIG. 20 is a circuit diagram to show a high frequency amplifier which is a detailed form of the embodiment 13 of the present invention.

FIGS. 19 and 20 are respectively diagrams to show detailed embodiments of the high frequency amplifier according to the embodiment 13.

As shown in FIG. 19, the high frequency amplifier according to the detailed embodiment of the embodiment 13 is a high frequency amplifier which makes use of a common emitter amplifying bipolar transistor 103 and causes a constant current source 104c and a bias feed resistor 107a to supply a DC bias to a base terminal of the amplifying bipolar transistor 103, in that a base bias compensating circuit 111 is provided which comprises at least one switch (switch bipolar transistor 112a) driven by a base potential VBE of the amplifying bipolar transistor 103 and a constant current source (constant voltage source 105b and bias resistor 108c), and in which one terminal of the switch is connected to the base terminal of the amplifying bipolar transistor 103, and the other terminal thereof is connected to the constant current source. The connecting unit 110a employed in the embodiment 13 is replaced by the diode-connected switch bipolar transistor 112a, and the constant current source 104b employed in the embodiment 13 is implemented by the constant voltage source 105b and the bias resistor 108c.

As shown in FIG. 20, the high frequency amplifier according to the detailed embodiment of the embodiment 13 is a high frequency amplifier which makes use of a common emitter amplifying bipolar transistor 103 and causes a constant current source 104c and a bias feed resistor 107a to supply a DC bias to a base terminal of the amplifying bipolar transistor 103, in that a base bias compensating circuit 111 is provided which comprises switches driven by a base potential VBE of the amplifying bipolar transistor 103 (switch bipolar transistors 112a and 112b) more than at least one and a current source (constant voltage source 105b and bias resistor 108c), and in which one terminal of one of the switches is connected to the base terminal of the amplifying bipolar transistor 103, and the other terminal of the other thereof is connected to the constant current source. The connecting units 110a and 110b employed in the embodiment 13 are respectively replaced by the diode-connected switch bipolar transistors 112a and 112b, and the constant current source 104b employed in the embodiment 13 is implemented by the constant voltage source 105b and the bias resistor 108c.

An effect similar to the embodiment 13 (FIG. 17) can be obtained by the detailed embodiment shown in FIG. 19, of the embodiment 13.

Further, an effect similar to the modified embodiment (FIG. 18) of the embodiment 13 can be obtained by the detailed embodiment shown in FIG. 20, of the embodiment 13.

Embodiment 14

Figure 21:
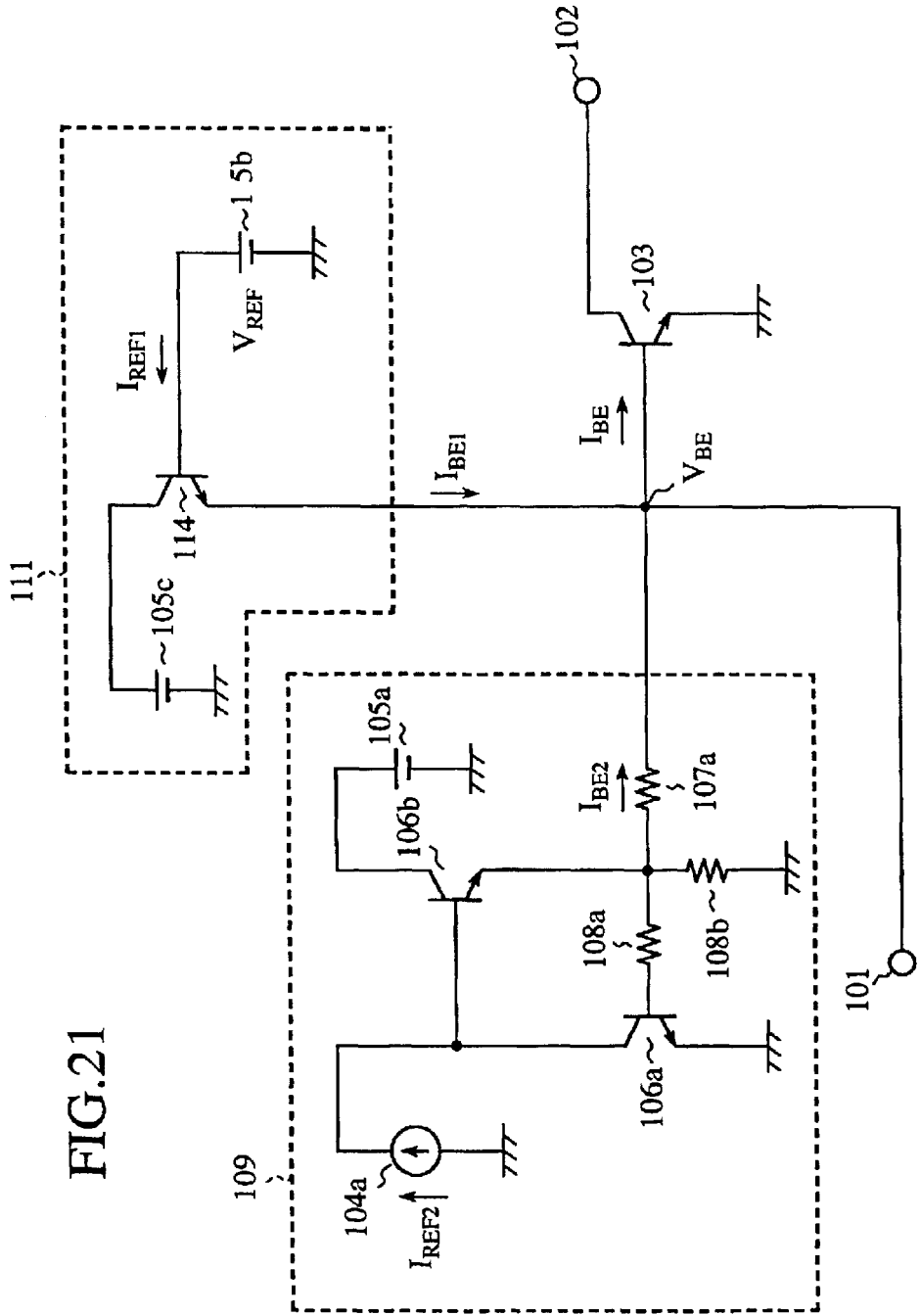
FIG. 21 is a circuit diagram to illustrate a high frequency amplifier which is an embodiment 14 of the present invention.

FIG. 21 shows a high frequency amplifier illustrative of an embodiment 14 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 104a indicates a constant current source, reference numerals 105a, 105b and 105c indicate constant voltage sources, reference numerals 106a and 106b indicate bias bipolar transistors, reference numeral 107a indicates a bias feed resistor for supplying a DC bias to its corresponding base terminal of the amplifying bipolar transistor 103, reference numerals 108a and 108b indicate bias resistors, reference numeral 109 indicates a current mirror bias circuit which comprises the constant current source 104a, the constant voltage source 105a, the bias bipolar transistors 106a and 106b, the bias feed resistor 107a, and the bias resistors 108a and 108b, reference numeral 114 indicates a base bias compensating bipolar transistor, and reference numeral 111 indicates a base bias compensating circuit which comprises the constant voltage sources 105b and 105c, and the base bias compensating bipolar transistor 114, respectively.

A configuration will next be shown.

As shown in FIG. 21, the high frequency amplifier according to the embodiment 14 is a high frequency amplifier which makes use of the common emitter amplifying bipolar transistor 103 and causes the current mirror bias circuit 109 to supply the DC bias to the base terminal of the amplifying bipolar transistor 103, in that an emitter terminal of the base bias compensating bipolar transistor 114 whose collector and base terminals are respectively connected to the constant voltage sources 105c and 105b, is connected to the base terminal of the common emitter amplifying bipolar transistor 103.

The operation and an effect will be described below.

The high frequency amplifier according to the embodiment 14 is one in that the high frequency signal input to the input terminal 101 is amplified by the amplifying bipolar transistor 103 and the amplified signal is taken out from the output terminal 102. In order to operate the amplifying bipolar transistor 103, there is a need to supply a DC bias to the base terminal of the amplifying bipolar transistor 103. When the high frequency signal power input to the input terminal 101 is sufficiently low, i.e., upon a linear operation of the amplifying bipolar transistor 103, a DC bias is mainly supplied to the base terminal of the amplifying bipolar transistor 103 from the current mirror bias circuit 109. When the high frequency signal power input to the input terminal 101 is high, i.e., upon a non-linear operation of the amplifying bipolar transistor 103, a DC bias is mainly supplied thereto from the base bias compensating circuit 111.

The operation of the base bias compensating circuit 111 will be described below.

The base bias compensating bipolar transistor 114 forms an emitter follower circuit in that a collector terminal thereof is connected to the constant voltage source 105b and an emitter terminal thereof is connected to the base terminal of the amplifying bipolar transistor 103. When the difference between a voltage generated by the constant voltage source 105b and a base potential VBE of the amplifying bipolar transistor 103 is sufficiently large, i.e., the base bias compensating transistor 114 is in a forward active region, an emitter current that flows in the base bias compensating transistor 114, is determined mainly by a base-to-emitter voltage, i.e., the difference VREF−VBE between a base voltage of VREF generated by the constant voltage source 105c and the base potential VBE of the amplifying bipolar transistor 103. Here, the voltage at which the emitter current of the base bias compensating bipolar transistor 114 flows, is defined as VBE_ON.

When VBE_ON>VREF−VBE, the emitter current of the base bias compensating transistor 114 does not flow, i.e., no current flows from the base bias compensating circuit 111 to the base terminal of the amplifying bipolar transistor 103.

On the other hand, when VBE_ON<VREF−VBE, the emitter current of the base bias compensating bipolar transistor 114 flows and is supplied to the base terminal of the amplifying bipolar transistor 103 as a DC bias.

VBE_ON and VREF are set so that VBE_ON>VREF−VBE_S with respect to VBE_ON at a base potential VBE_S at the time when the high frequency signal power input to the input terminal 101 is sufficiently small, i.e., at the linear operation of the amplifying bipolar transistor 3, whereby a DC bias is supplied mainly from the current mirror bias circuit 109 to the base terminal.

On the other hand, as the high frequency signal power input to the input terminal 101 increases, the base current of the amplifying bipolar transistor 103 increases and a drop in base potential occurs. With this, the bias current supplied from the current mirror bias circuit 109 increases.

Therefore, the base potential of the amplifying bipolar transistor 103 further drops due to the development of a voltage drop across the bias feed resistor 107a. When the condition VBE_ON<VREF−VBE_L is established with respect to a base potential VBE_L at this time, the emitter current of the base bias compensating transistor 114 flows, i.e., the current flows from the base bias compensating circuit 111 to the base terminal of the amplifying bipolar transistor 103. Therefore, the amount of an increase in base bias current supplied from the current mirror bias circuit 109 can be relaxed.

Thus, an effect is obtained in a manner similar to the embodiment 12 in which a constant current operation which shows low dependence on a change in power supply voltage and being good against a process variations of each transistor owing to the main supply of the DC bias from the current mirror bias circuit 109 upon the input of a high frequency signal having low power, and a constant voltage operation high in saturation characteristic owing to the main supply of the DC bias from the base bias compensating circuit 111 upon the input of a bulk power high frequency signal can be implemented simultaneously.

Further, since an idle current at the input of a small-power high frequency signal, which flows in reference voltage bipolar transistors 113a, 113b and 113c for obtaining VREF1 employed in the high frequency amplifier according to the embodiment 12, becomes unnecessary, current consumption can be reduced.

Incidentally, VBE_ON of the base bias compensating circuit 111 employed in the high frequency amplifier according to the embodiment 14 can be arbitrarily set according to the size of the base bias compensating bipolar transistor 114 and the voltage value of VBE.

The current mirror bias circuit 109 is configured as a circuit system using the bias bipolar transistor 106b to execute a reduction in error by the finite output resistance of the bipolar transistor in the present embodiment. However, even when another current mirror bias circuit system is used, e.g., even when a basic current mirror constant current circuit, a Weidler type current mirror constant current circuit or a Wilson type current mirror constant current circuit, or the like which eliminates the bias bipolar transistor 106b and short-circuits the collector terminal and the base terminal of the bias bipolar transistor 106a, and the base bias compensating circuit 111 employed in the embodiment 13 are utilized in combination, a similar effect can be obtained.

Embodiment 15

Figure 22:
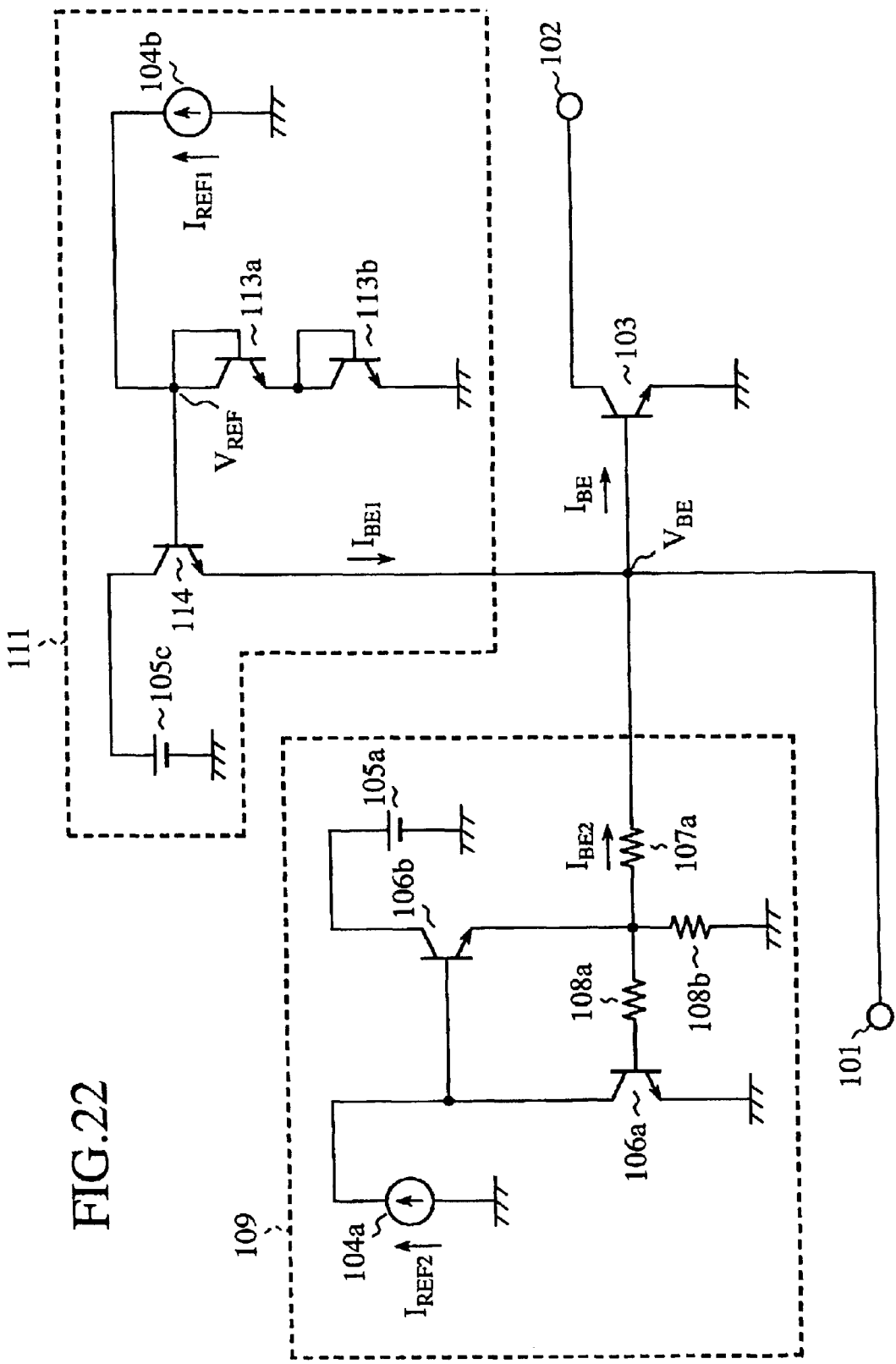
FIG. 22 is a circuit diagram to show a high frequency amplifier which is an embodiment 15 of the present invention.

FIG. 22 shows a high frequency amplifier illustrative of an embodiment 15 of the present invention. The constant voltage source 105b, which constitutes the base bias compensating circuit 111 of the high frequency amplifier according to the embodiment 14 is implemented by a constant current source 104b and reference voltage bipolar transistors 113a and 113b whose base/collector terminals are respectively short-circuit connected.

Namely, the high frequency amplifier according to the embodiment 15 is one in that in the high frequency amplifier according to the embodiment 14, the constant voltage source 105b connected to the base terminal of the base bias compensating bipolar transistor 114 is made up of the constant current source 104b and diode switches 113a and 113b more than at least one, whose collector/base terminals are respectively short-circuit connected.

Since a base bias compensating circuit 111 and a current mirror bias circuit 109 employed in the embodiment 15 are similar in operation to the embodiment 14, the description thereof will be omitted.

Owing to the above configuration, an effect similar to the embodiment 14 is obtained and the base bias compensating circuit 111 can be made resistant to variations in power supply.

Incidentally, VBE_ON of the base bias compensating circuit 111 employed in the high frequency amplifier according to the embodiment 15 can be arbitrarily set according to the sizes of the reference voltage bipolar transistors 113a and 113b and the size of the base bias compensating bipolar transistor 114, respectively.

While the number of the reference voltage bipolar transistors is provided as two, more than at least one may be provided as long as a desired VREF is obtained.

The current mirror bias circuit 109 is configured as a circuit system using the bias bipolar transistor 106b to perform a reduction in error by the finite output resistance of the bipolar transistor in the present embodiment. However, even when another current mirror bias circuit system is used, e.g., even when a basic current mirror constant current circuit, a Weidler type current mirror constant current circuit or a Wilson type current mirror constant current circuit, or the like which eliminates the bias bipolar transistor 106b and short-circuits the collector terminal and the base terminal of the bias bipolar transistor 106a, and the base bias compensating circuit 111 employed in the embodiment 15 are utilized in combination, a similar effect can be obtained.

Embodiment 16

Figure 23:
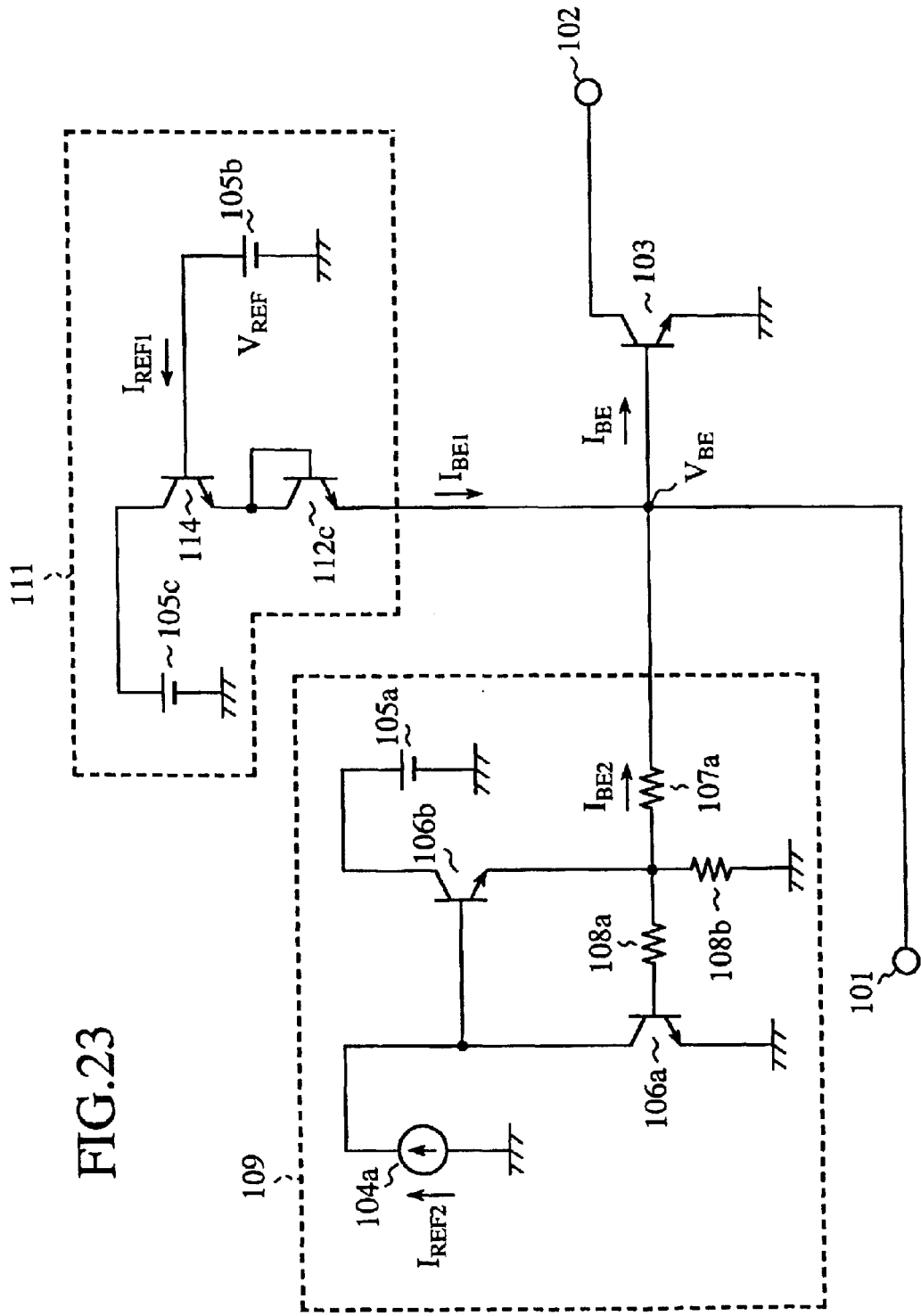
FIG. 23 is a circuit diagram to illustrate a high frequency amplifier which is an embodiment 16 of the present invention.

FIG. 23 shows a high frequency amplifier illustrative of an embodiment 16 of the present invention. The present embodiment is one in that in the high frequency amplifier according to the embodiment 14, a switch bipolar transistor 112c whose collector/base terminals are short-circuit connected, is inserted between the base terminal of the amplifying bipolar transistor 103 and the emitter terminal of the base bias compensating bipolar transistor.

Namely, the high frequency amplifier according to the embodiment 16 is one in that in the high frequency amplifier according to the embodiment 14, the diode switch 112c whose collector/base terminals are short-circuited, is inserted between the emitter terminal of the base bias compensating bipolar transistor 114 and the base terminal of the common emitter amplifying bipolar transistor 103.

Since a base bias compensating circuit 111 and a current mirror bias circuit 109 employed in the embodiment 16 are similar in operation to the embodiment 14, the description thereof will be omitted.

Owing to the above configuration, an effect similar to the embodiment 14 is obtained. A decrease in the impedance of the base bias compensating circuit 111 as viewed from the amplifying bipolar transistor 103 can be relaxed which occurs when the current flows from the base bias compensating circuit 111 to the base terminal of the amplifying bipolar transistor 103 upon the input of a bulk power high frequency signal, whereby degradation of a noise factor can be reduced.

Embodiment 17

Figure 24:
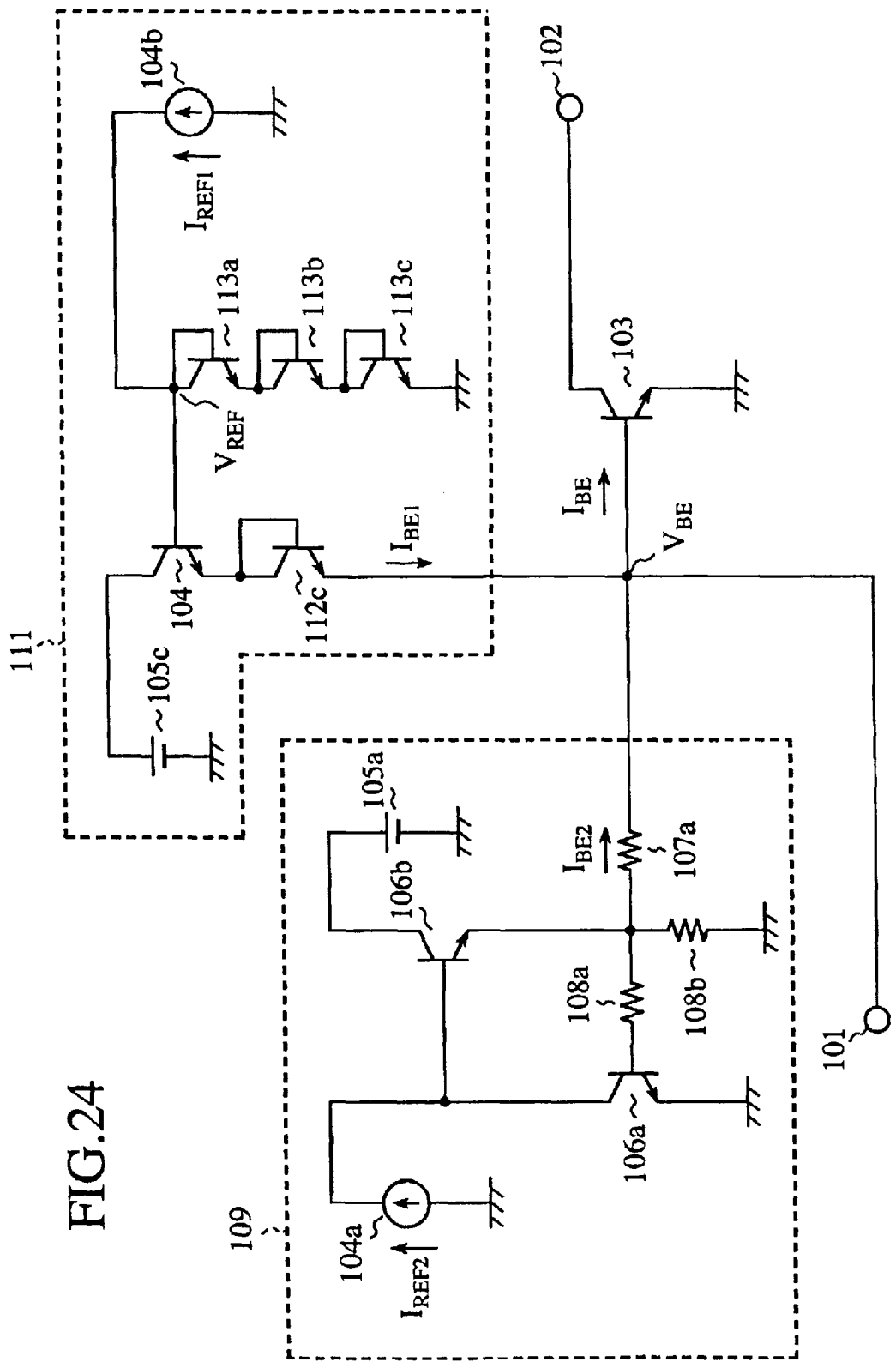
FIG. 24 is a circuit diagram to depict a high frequency amplifier which is an embodiment 17 of the present invention.

FIG. 24 shows a high frequency amplifier illustrative of an embodiment 17 of the present invention. The present embodiment is one in that in the high frequency amplifier according to the embodiment 15, a switch bipolar transistor 112c whose collector/base terminals are short-circuit connected, is inserted between the base terminal of the amplifying bipolar transistor 103 and the emitter terminal of the base bias compensating bipolar transistor 114.

Namely, the high frequency amplifier according to the embodiment 17 is one in that in the high frequency amplifier according to the embodiment 15, the diode switch 112c whose collector/base terminals are short-circuited, is inserted between the emitter terminal of the base bias compensating bipolar transistor 114 and the base terminal of the common emitter amplifying bipolar transistor 103.

Since a base bias compensating circuit 111 and a current mirror bias circuit 109 employed in the embodiment 17 are similar in operation to the embodiment 15 (and the embodiment 14), the description thereof will be omitted.

Owing to the above configuration, an effect similar to the embodiment 15 is obtained. A drop in the impedance of the base bias compensating circuit 111 as viewed from the amplifying bipolar transistor 103 can be relaxed which occurs when the current flows from the base bias compensating circuit 111 to the base terminal of the amplifying bipolar transistor 103 upon the input of a bulk power high frequency signal, whereby degradation of a noise figure can be reduced.

Incidentally, VBE_ON of the base bias compensating circuit 111 employed in the high frequency amplifier according to the embodiment 17 can be arbitrarily set according to the sizes of reference voltage bipolar transistors 113a, 113b and 113c and the size of the base bias compensating bipolar transistor 114 respectively.

While the number of the reference voltage bipolar transistors is provided as three, more than at least one may be provided as long as a desired VREF is obtained.

The current mirror bias circuit 109 is configured as a circuit system using a bias bipolar transistor 106b to perform a reduction in error by the finite output resistance of the bipolar transistor in the present embodiment. However, even when another current mirror bias circuit system is used, e.g., even when a basic current mirror constant current circuit, a Weidler type current mirror constant current circuit or a Wilson type current mirror constant current circuit, or the like which eliminates the bias bipolar transistor 106b and short-circuits the collector terminal and base terminal of a bias bipolar transistor 106a, and the base bias compensating circuit 111 employed in the embodiment 16 are utilized in combination, a similar effect can be obtained.

Embodiment 18

Figure 25:
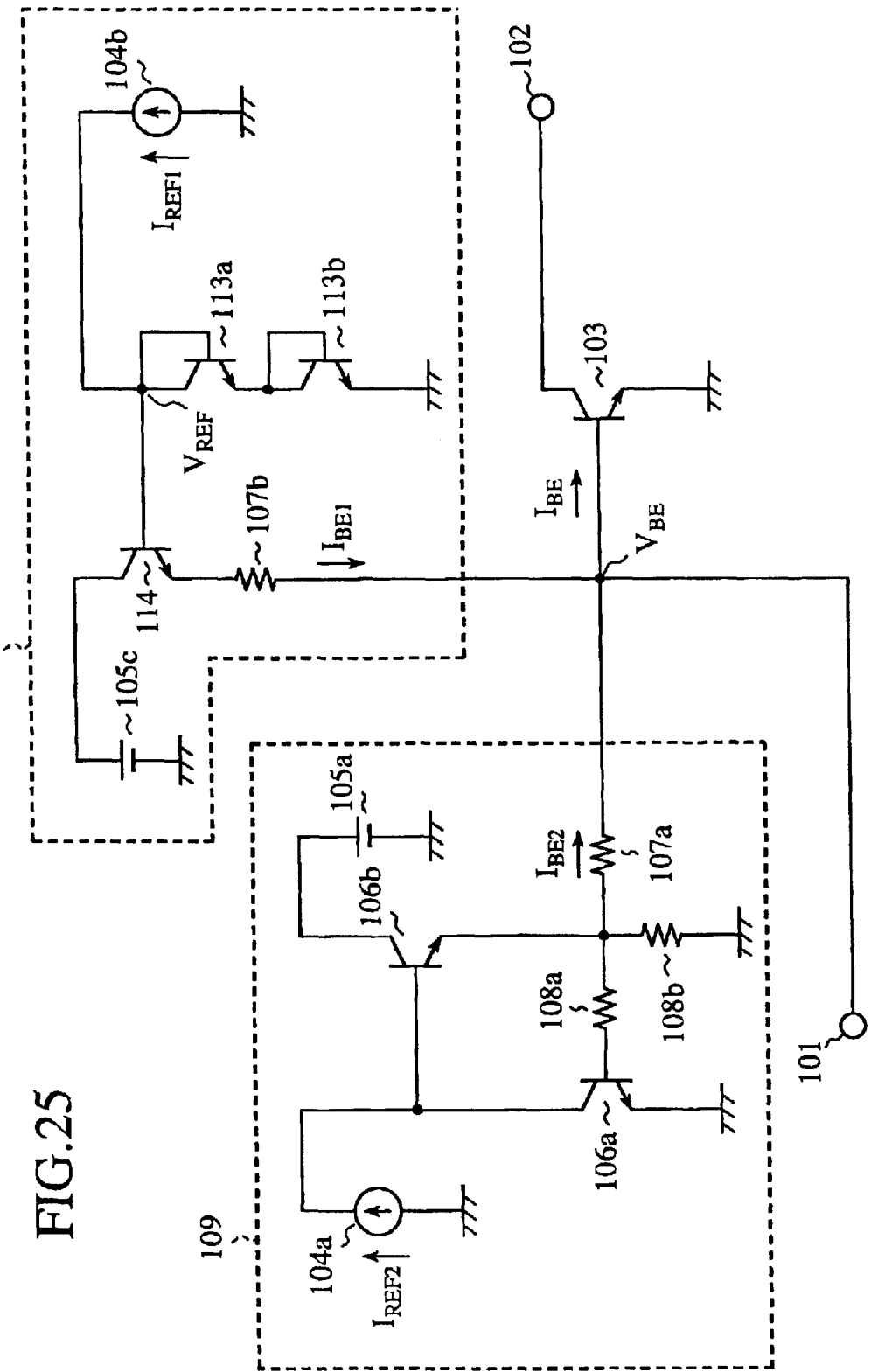
FIG. 25 is a circuit diagram to illustrate a high frequency amplifier which is an embodiment 18 of the present invention.

FIG. 25 shows a high frequency amplifier illustrative of an embodiment 18 of the present invention. The present embodiment is one in that in the high frequency amplifier according to the embodiment 15, a bias feed resistor 107b is inserted between the base terminal of the amplifying bipolar transistor 103 and the emitter terminal of the base bias compensating bipolar transistor 114.

Namely, the high frequency amplifier according to the embodiment 18 is one in that in the high frequency amplifier according to the embodiment 15, the resistor 107b is inserted between the emitter terminal of the base bias compensating bipolar transistor 114 and the base terminal of the common emitter amplifying bipolar transistor 103.

Since a base bias compensating circuit 111 and a current mirror bias circuit 109 employed in the embodiment 18 are similar in operation to the embodiment 15 (and the embodiment 14), the description thereof will be omitted.

Owing to such a configuration as described above, an effect similar to the embodiment 15 is obtained. A drop in the impedance of the base bias compensating circuit 111 as viewed from the amplifying bipolar transistor 103 can be relaxed which occurs when the current flows from the base bias compensating circuit 111 to the base terminal of the amplifying bipolar transistor 103 upon the input of a bulk power high frequency signal, whereby degradation of a noise figure can be reduced.

Incidentally, VBE_ON of the base bias compensating circuit 111 employed in the high frequency amplifier according to the embodiment 18 can be arbitrarily set according to the sizes of reference voltage bipolar transistors 113a and 113b and the size of the base bias compensating bipolar transistor 114 respectively.

While the number of the reference voltage bipolar transistors is provided as two, more than at least one may be provided as long as a desired VREF is obtained.

The current mirror bias circuit 109 is configured as a circuit system using a bias bipolar transistor 106b to perform a reduction in error by the finite output resistance of the bipolar transistor in the present embodiment. However, even when another current mirror bias circuit system is used, e.g., even when a basic current mirror constant current circuit, a Weidler type current mirror constant current circuit or a Wilson type current mirror constant current circuit, or the like which eliminates a bias bipolar transistor 106b and short-circuits the collector terminal and base terminal of a bias bipolar transistor 106a, and the base bias compensating circuit 111 employed in the embodiment 18 are utilized in combination, a similar effect can be obtained.

Embodiment 19

Figure 26:
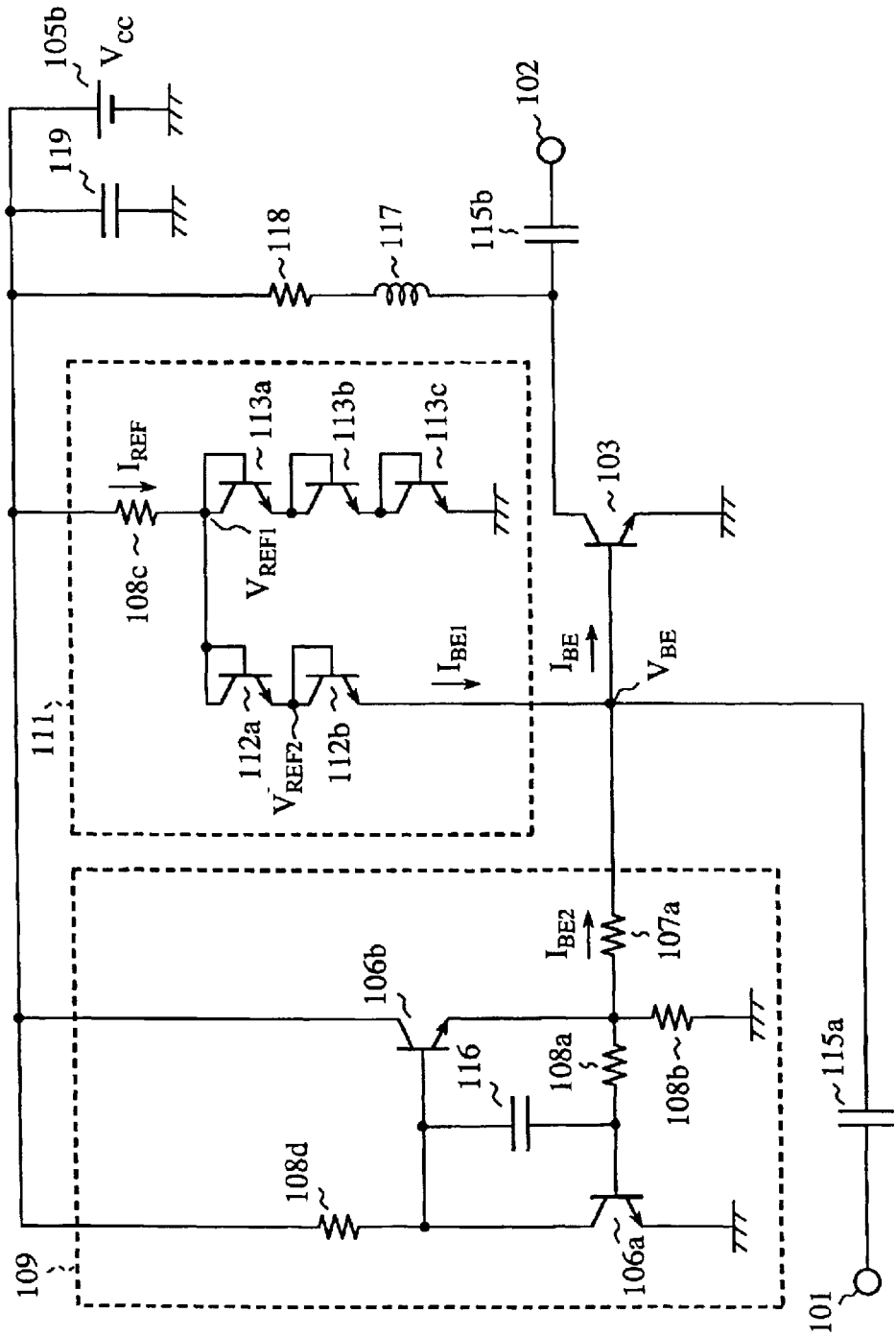
FIG. 26 is a circuit diagram to show a high frequency amplifier which is an embodiment 19 of the present invention.

FIG. 26 is a detailed circuit diagram of a high frequency amplifier to show an embodiment 19 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 105b indicates a constant voltage source, reference numerals 106a and 106b indicate bias bipolar transistors, reference numeral 107a indicates a bias feed resistor for supplying a DC bias to its corresponding base terminal of the amplifying bipolar transistor 103, reference numerals 108a, 108b, 108c and 108d indicate bias resistors, reference numerals 112a and 112b indicate switch bipolar transistors, reference numerals 113a, 113b and 113c indicate reference voltage bipolar transistors, reference numerals 115a and 115b indicate DC cut capacitors, reference numeral 116 indicates an oscillation preventive capacitor, reference numeral 117 indicates a bias feed inductor, reference numeral 118 indicates a stabilization resistor, reference numeral 119 indicates a bypass capacitor, reference numeral 109 indicates a current mirror bias circuit which comprises the bias bipolar transistors 106a and 106b, the bias feed resistor 107a, the bias resistors 108a, 108b and 108c, and the oscillation preventive capacitor 116, and reference numeral 111 indicates a base bias compensating circuit which comprises the bias resistor 108d, the switch bipolar transistors 112a and 112b and the reference voltage bipolar transistors 113a, 113b and 113c, respectively.

A configuration will next be explained.

The high frequency amplifier according to the embodiment 19 is a high frequency amplifier which makes use of the common emitter amplifying bipolar transistor 103 and causes the current mirror bias circuit 109 to supply the DC bias to the base terminal of the amplifying bipolar transistor 103, in that the base bias compensating circuit 111 is provided which comprises the two series-connected switches (switch bipolar transistors) 112a and 112b driven by a base potential VBE of the amplifying bipolar transistor 103 and a constant current source 104b, and in which one terminal of one of the series-connected switches (switch bipolar transistors) 112a and 112b is connected to the base terminal of the amplifying bipolar transistor 103, and the other terminal of the other thereof is connected to the constant current source 104b. Further, the constant current source 104b, which constitutes the base bias compensating circuit 111, is implemented by the bias resistor 108c and the constant voltage source 105b. The switches 112a and 112b are configured as diode switches 112a and 112b whose bases and collectors are short-circuit connected. An emitter terminal of the first diode switch 112a and collector/base terminals of the second diode switch 112b are connected in series. An emitter terminal of the second diode switch 112b is connected to the base terminal of the common emitter bipolar transistor 103. The collector/base terminals of the first diode switch 112a are connected to the resistor 108c. A reference voltage for each diode switch is supplied from series-connected diode switches 113a, 113b and 113c more than at least one.

For the current mirror bias circuit 109 and the base bias compensating circuit 111 in the high frequency amplifier according to the embodiment 19, the current mirror bias circuit 9 is substantially identical in configuration to the embodiment 4, whereas the configuration of the base bias compensating circuit 111 is identical to the detailed configuration (FIG. 19) of the embodiment 13. The current mirror bias circuit 109 and the base bias compensating circuit 111 share the use of the constant voltage source 105b.

Thus, since the current mirror bias circuit 109 and the base bias compensating circuit 111 are respectively similar in operation to the embodiment 14 and the embodiment 13, the description thereof will be omitted.

Owing to the embodiment 19, an effect similar to the embodiment 13 can be obtained.

Incidentally, while the constant current source 104a and the constant current source 104b are respectively configured by the bias resistor 108d and the constant voltage source 105b, and the bias resistor 108c and the constant voltage source 105b here, another configuration may be adopted if a circuit similar to it, for generating a constant current is taken.

A DC bias is supplied from the constant voltage source 105b from the collector terminal of the amplifying bipolar transistor 103 via the bias feed inductor 117 and the stabilization resistor 118 here. Further, the bias inductor 117 aims to increase the impedance as the constant voltage source 105b is seen from the collector terminal thereof at the high frequency, and the stabilization resistor 118 aims to reduce an unstable operation such as oscillations. However, either one of them or another one capable of obtaining a similar effect may be used.

Embodiment 20

Figure 27:
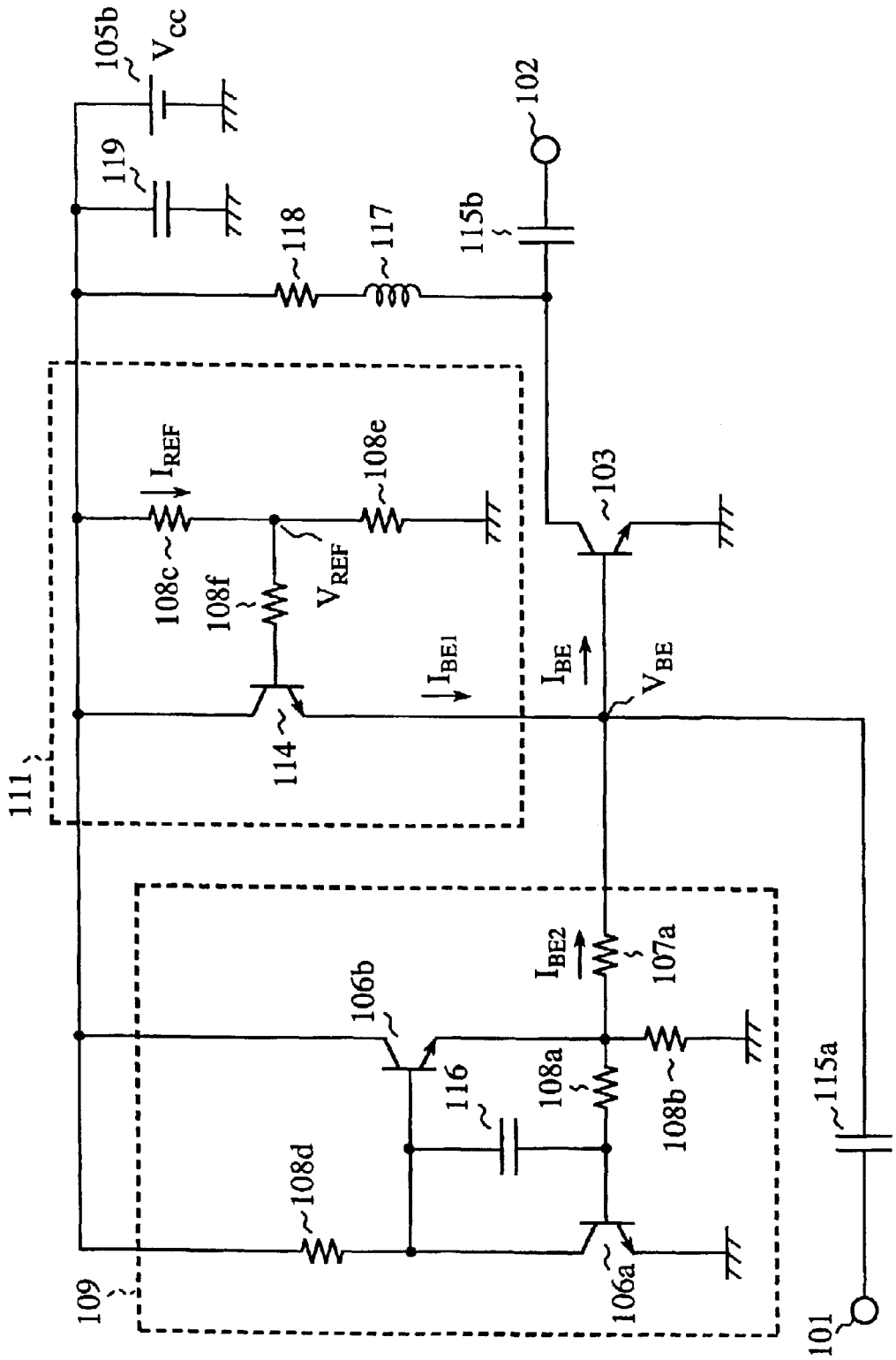
FIG. 27 is a circuit diagram to illustrate a high frequency amplifier which is an embodiment 20 of the present invention.

FIG. 27 shows a detailed circuit diagram of a high frequency amplifier illustrative of an embodiment 20 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 105b indicates a constant voltage source, reference numerals 106a and 106b indicate bias bipolar transistors, reference numeral 107a indicates a bias feed resistor for supplying a DC bias to its corresponding base terminal of the amplifying bipolar transistor 103, reference numerals 108a, 108b, 108c, 108d, 108e and 108f indicate bias resistors, reference numeral 114 indicates a base bias compensating bipolar transistor, reference numerals 115a and 115b indicate DC cut capacitors, reference numeral 116 indicates an oscillation preventive capacitor, reference numeral 117 indicates a bias feed inductor, reference numeral 118 indicates a stabilization resistor, reference numeral 119 indicates a bypass capacitor, reference numeral 109 indicates a current mirror bias circuit which comprises the bias bipolar transistors 106a and 106b, the bias feed resistor 107a, the bias resistors 108a, 108b and 108c, and the oscillation preventive capacitor 116, and reference numeral 111 indicates a base bias compensating circuit which comprises the bias resistors 108c, 108e and 108f, and the base bias compensating bipolar transistor 114, respectively.

A configuration will next be explained.

The high frequency amplifier according to the embodiment 20 is a high frequency amplifier which makes use of the common emitter amplifying bipolar transistor 103 and causes the current mirror bias circuit 109 to supply a DC bias to the base terminal of the amplifying bipolar transistor 103, in that an emitter terminal of the base bias compensating bipolar transistor 114 whose collector terminal and base terminal are respectively connected to constant voltage sources 105c and 105b, is connected to the base terminal of the common emitter amplifying bipolar transistor 103.

The base bias compensating circuit 111 employed in the embodiment 20 is similar to the base bias compensating circuit 111 employed in the embodiment 14 except that a DC bias of the base bias compensating bipolar transistor 114 is supplied from the constant voltage source 105b through the use of the bias resistors 108c, 108e and 108f. Further, the current mirror bias circuit 109 of the embodiment 10 is similar in configuration to the current mirror bias circuit 109 of the embodiment 19.

Thus, since the operation of the base bias compensating circuit 111 and the operation of the current mirror bias circuit 109 are similar to the embodiment 14, the description thereof will be omitted.

Owing to the embodiment 20, an effect similar to the embodiment 14 can be obtained.

Incidentally, while the constant voltage source 105c is configured by the bias resistors 108c, 108e and 108f and the constant voltage source 105b here, another configuration may be adopted if a circuit similar to it, for generating a constant current is taken.

While the constant current source 104a is configured by the bias resistor 108d and the constant voltage source 105b here, another configuration may be taken if a circuit similar to it, for generating a constant current is used.

A DC bias is supplied from the constant voltage source 105b to the collector terminal of the amplifying bipolar transistor 103 via the bias feed inductor 117 and the stabilization resistor 118 here. Further, the bias inductor 117 aims to increase the impedance as the constant voltage source 105b is seen from the collector terminal thereof at the high frequency, and the stabilization resistor 118 aims to reduce an unstable operation such as oscillations. However, either one of them or another one capable of obtaining a similar effect may be used.

Embodiment 21

Figure 28:
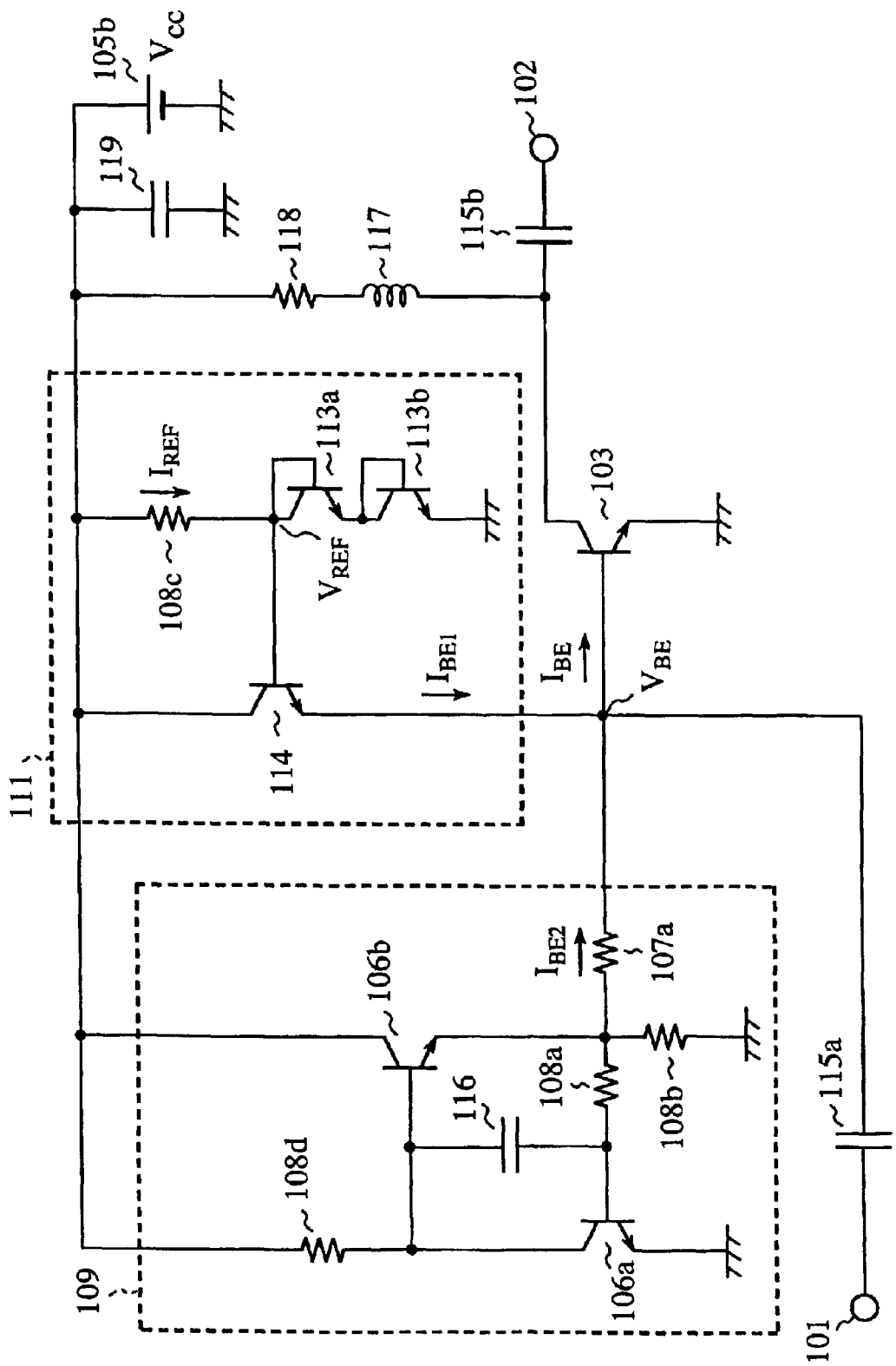
FIG. 28 is a circuit diagram to depict a high frequency amplifier which is an embodiment 21 of the present invention.

FIG. 28 shows a detailed circuit diagram of a high frequency amplifier illustrative of an embodiment 21 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 105b indicates a constant voltage source, reference numerals 106a and 106b indicate bias bipolar transistors, reference numeral 107a indicates a bias feed resistor for supplying a DC bias to its corresponding base terminal of the amplifying bipolar transistor 103, reference numerals 108a, 108b, 108c and 108d indicate bias resistors, reference numerals 113a and 13b indicate reference voltage bipolar transistors, reference numeral 114 indicates a base bias compensating bipolar transistor, reference numerals 115a and 115b indicate DC cut capacitors, reference numeral 116 indicates an oscillation preventive capacitor, reference numeral 117 indicates a bias feed inductor, reference numeral 118 indicates a stabilization resistor, reference numeral 119 indicates a bypass capacitor, reference numeral 109 indicates a current mirror bias circuit which comprises the bias bipolar transistors 106a and 106b, the bias feed resistor 107a, the bias resistors 108a, 108b and 108c, and the oscillation preventive capacitor 116, and reference numeral 111 indicates a base bias compensating circuit which comprises the bias resistor 108d, the reference voltage bipolar transistors 113a and 113b and the base bias compensating bipolar transistor 114, respectively.

A configuration will next be explained.

The high frequency amplifier according to the embodiment 21 is a high frequency amplifier which makes use of the common emitter amplifying bipolar transistor 103 and causes the current mirror bias circuit 109 to supply the DC bias to the base terminal of the amplifying bipolar transistor 103, in that an emitter terminal of the base bias compensating bipolar transistor 114 whose collector terminal and base terminal are connected to their corresponding constant voltage sources 105c and 105b, is connected to the base terminal of the common emitter amplifying bipolar transistor 103.

The base bias compensating circuit 111 employed in the embodiment 21 is similar to the base bias compensating circuit 111 employed in the embodiment 14 except that a DC bias of the base bias compensating bipolar transistor 114 is supplied from the constant voltage source 105b through the use of the bias resistor 108c and the reference voltage bipolar transistors 113a and 113b. Further, the current mirror bias circuit 109 of the embodiment 21 is similar in configuration to the current mirror bias circuit 109 of the embodiment 19.

Thus, since the operation of the base bias compensating circuit 111 and the operation of the current mirror bias circuit 109 are similar to the embodiment 14, the description thereof will be omitted.

Owing to the embodiment 21, an effect similar to the embodiment 14 can be obtained.

Incidentally, while the constant current source 104a and the constant current source 104b are respectively configured by the bias resistor 108d and the constant voltage source 105b, and the bias resistor 108c and the constant voltage source 105b here, another configuration may be adopted if a circuit similar to it, for generating a constant current is taken.

Incidentally, a DC bias is supplied from the constant voltage source 105b to the collector terminal of the amplifying bipolar transistor 103 via the bias feed inductor 117 and the stabilization resistor 118 here. Further, the bias inductor 117 aims to increase the impedance as the constant voltage source 105b is seen from the collector terminal thereof at the high frequency, and the stabilization resistor 118 aims to reduce an unstable operation such as oscillations. However, either one of them or another one capable of obtaining a similar effect may be used.

Embodiment 22

Figure 29:
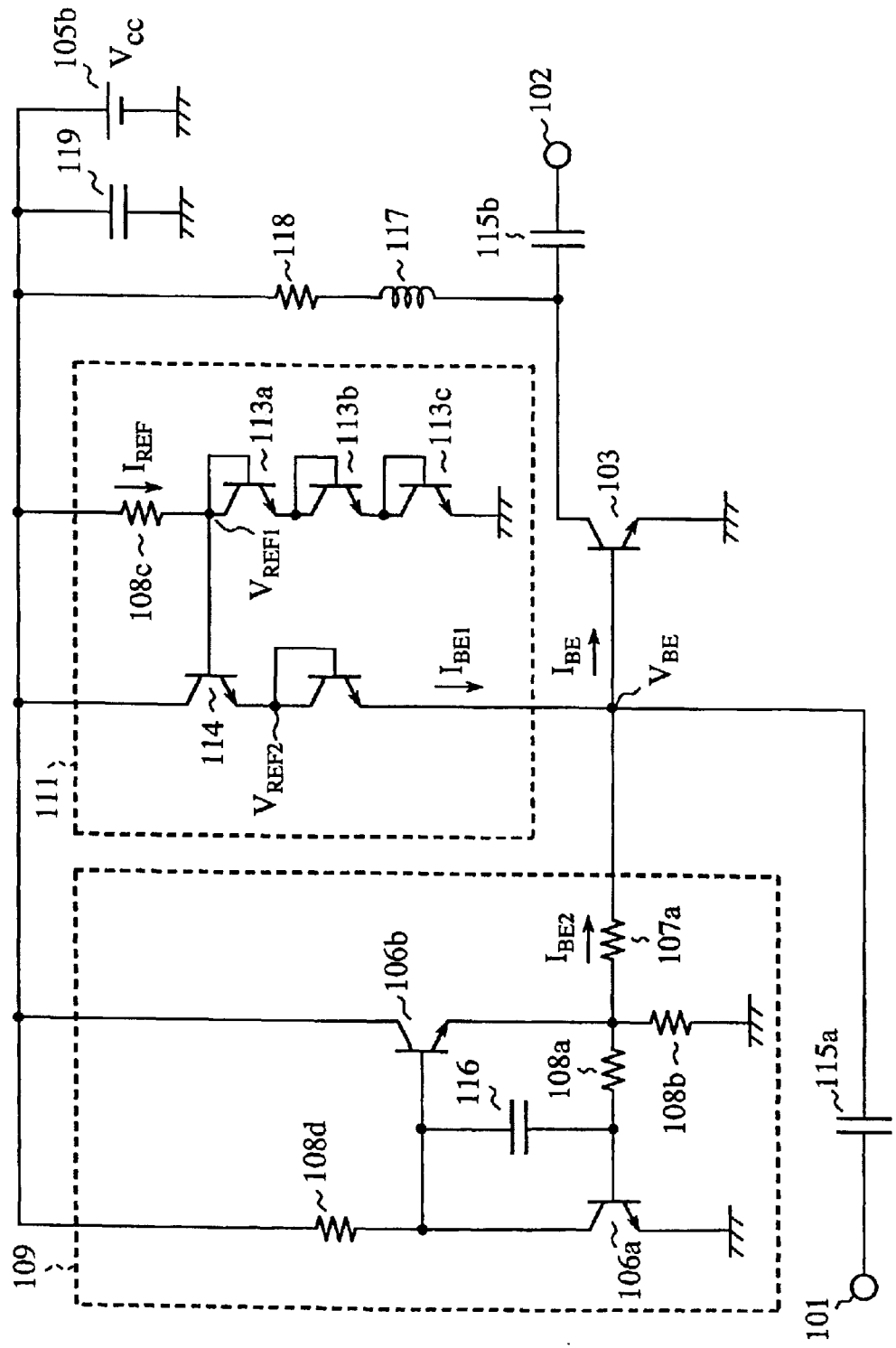
FIG. 29 is a circuit diagram to illustrate a high frequency amplifier which is an embodiment 22 of the present invention.

FIG. 29 shows a detailed circuit diagram of a high frequency amplifier illustrative of an embodiment 22 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 105b indicates a constant voltage source, reference numerals 106a and 106b indicate bias bipolar transistors, reference numeral 107a indicates a bias feed resistor for supplying a DC bias to its corresponding base terminal of the amplifying bipolar transistor 103, reference numerals 108a, 108b, 108c and 108d indicate bias resistors, reference numerals 113a, 113b and 113c indicate reference voltage bipolar transistors, reference numeral 114 indicates a base bias compensating bipolar transistor, reference numeral 114b indicates a switch bipolar transistor, reference numerals 115a and 115b indicate DC cut capacitors, reference numeral 116 indicates an oscillation preventive capacitor, reference numeral 117 indicates a bias feed inductor, reference numeral 118 indicates a stabilization resistor, reference numeral 119 indicates a bypass capacitor, reference numeral 109 indicates a current mirror bias circuit which comprises the bias bipolar transistors 106a and 106b, the bias feed resistor 107a, the bias resistors 108a, 108b and 108c, and the oscillation preventive capacitor 116, and reference numeral 111 indicates a base bias compensating circuit which comprises the bias resistor 108d, the reference voltage bipolar transistors 113a, 113b and 113c, the base bias compensating bipolar transistor 114 and the switch bipolar transistor 114b, respectively.

A configuration will next be described.

The high frequency amplifier according to the embodiment 22 is a high frequency amplifier which makes use of the common emitter amplifying bipolar transistor 103 and causes the current mirror bias circuit 109 to supply the DC bias to the bipolar transistors, reference numeral 114 indicates a base bias compensating bipolar transistor, reference numerals 115a and 115b indicate DC cut capacitors, reference numeral 116 indicates an oscillation preventive capacitor, reference numeral 117 indicates a bias feed inductor, reference numeral 118 indicates a stabilization resistor, reference numeral 119 indicates a bypass capacitor, reference numeral 109 indicates a current mirror bias circuit which comprises the bias bipolar transistors 106a and 106b, the bias feed resistor 107a, the bias resistors 108a, 108b and 108c, and the oscillation preventive capacitor 116, and reference numeral 111 indicates a base bias compensating circuit which comprises the bias resistor 108d, the reference voltage bipolar transistors 113a and 113b and the base bias compensating bipolar transistor 114, respectively.

A configuration will next be described.

The high frequency amplifier according to the embodiment 23 is a high frequency amplifier which makes use of the common emitter amplifying bipolar transistor 103 and causes the current mirror bias circuit 109 to supply the DC bias to the base terminal of the amplifying bipolar transistor 103, in that an emitter terminal of the base bias compensating bipolar transistor 114 whose collector terminal and base terminal are connected to their corresponding constant voltage sources 105c and 105b, is connected to the base terminal of the common emitter amplifying bipolar transistor 103, and the bias feed resistor 107b is inserted between the emitter terminal of the base bias compensating bipolar transistor 114 and the base terminal of the common emitter amplifying bipolar transistor 103.

The base bias compensating circuit 111 of the embodiment 23 has a configuration in which the bias feed resistor 107b is base terminal of the amplifying bipolar transistor 103, in that an emitter terminal of the base bias compensating bipolar transistor 114 whose collector terminal and base terminal are connected to their corresponding constant voltage sources 105c and 105b, is connected to the base terminal of the common emitter amplifying bipolar transistor 103, and the diode switch 114b whose collector/base terminals are short-circuited, is inserted between the emitter terminal of the base bias compensating bipolar transistor 114 and the base terminal of the common emitter amplifying bipolar transistor 103.

The base bias compensating circuit 111 of the embodiment 22 has a configuration in which the switch bipolar transistor 114b and the reference voltage bipolar transistor 113a are added to the base bias compensating circuit 111 of the embodiment 21. Further, the current mirror bias circuit 109 of the embodiment 22 is similar in configuration to the current mirror bias circuit 109 of the embodiment 21.

Such a relationship of the embodiment 22 to the embodiment 21 is similar to the relation of the embodiment 17 (FIG. 24) to the embodiment 15 (FIG. 22).

Thus, since the operation of the base bias compensating circuit 111 and the operation of the current mirror bias circuit 109 both employed in the embodiment 22 are similar to the embodiment 17 relative to the embodiment 14 and the embodiment 15, the description thereof will be omitted.

Owing to the embodiment 22, an effect similar to the embodiment 17 relative to the embodiment 14 and the embodiment 15 is obtained.

Incidentally, while the constant current source 104a and the constant current source 104b are respectively configured by the bias resistor 108d and the constant voltage source 105b, and the bias resistor 108c and the constant voltage source 105b here, another configuration may be adopted if a circuit similar to it, for generating a constant current is taken.

Incidentally, a DC bias is supplied from the constant voltage source 105b to the collector terminal of the amplifying bipolar transistor 103 via the bias feed inductor 117 and the stabilization resistor 118 here. Further, the bias inductor 117 aims to increase the impedance as the constant voltage source 105b is seen from the collector terminal thereof at the high frequency, and the stabilization resistor 118 aims to reduce an unstable operation such as oscillations. However, either one of them or another one capable of obtaining a similar effect may be used.

Embodiment 23

Figure 30:
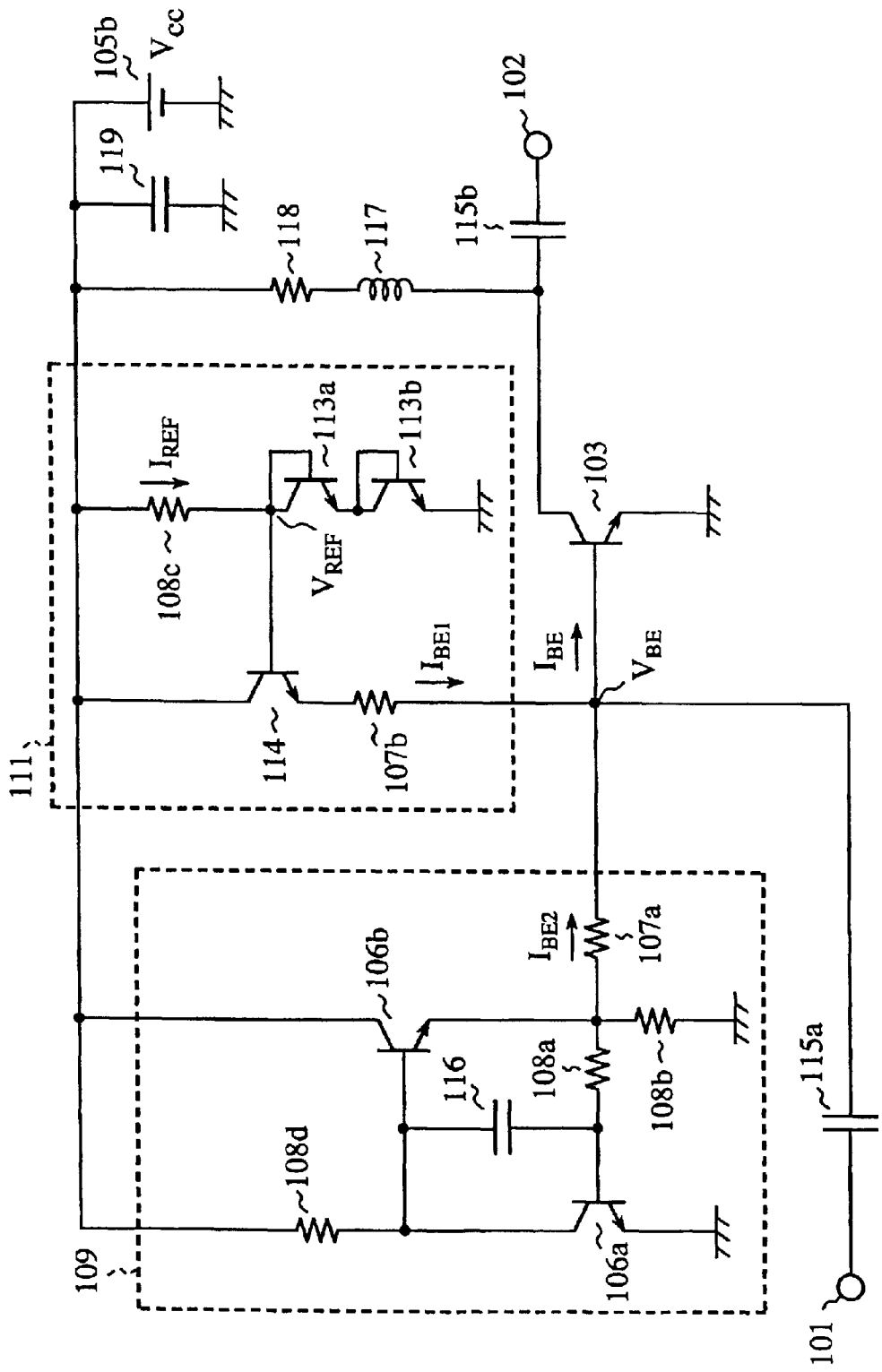
FIG. 30 is a circuit diagram to show a high frequency amplifier which is an embodiment 23 of the present invention.

FIG. 30 shows a detailed circuit diagram of a high frequency amplifier illustrative of an embodiment 23 of the present invention.

In the drawing, reference numeral 101 indicates an input terminal for a high frequency signal, reference numeral 102 indicates an output terminal for the high frequency signal, reference numeral 103 indicates an amplifying bipolar transistor, reference numeral 105b indicates a constant voltage source, reference numerals 106a and 106b indicate bias bipolar transistors, reference numerals 107a and 107b indicate bias feed resistors for supplying a DC bias to its corresponding base terminal of the amplifying bipolar transistor 103, reference numerals 108a, 108b, 108c and 108d indicate bias resistors, reference numerals 113a and 113b indicate reference voltage added to the base bias compensating circuit 111 of the embodiment 21. Further, the current mirror bias circuit 109 of the embodiment 22 is similar in configuration to the current mirror bias circuit 109 of the embodiment 21.

Such a relationship of the embodiment 23 to the embodiment 21 is similar to the relation of the embodiment 18 (FIG. 25) to the embodiment 15 (FIG. 22).

Thus, since the operation of the base bias compensating circuit 111 and the operation of the current mirror bias circuit 109 both employed in the embodiment 23 are similar to the embodiment 18 relative to the embodiment 14 and the embodiment 15, the description thereof will be omitted.

Owing to the embodiment 23, an effect similar to the embodiment 18 relative to the embodiment 14 and the embodiment 15 is obtained.

Incidentally, while the constant current source 104a and the constant current source 104b are respectively configured by the bias resistor 108d and the constant voltage source 105b, and the bias resistor 108c and the constant voltage source 105b here, another configuration may be adopted if a circuit similar to it, for generating a constant current is taken.

Incidentally, a DC bias is supplied from the constant voltage source 105b to the collector terminal of the amplifying bipolar transistor 103 via the bias feed inductor 117 and the stabilization resistor 118 here. Further, the bias inductor 117 aims to increase the impedance as the constant voltage source 105b is seen from the collector terminal thereof at the high frequency, and the stabilization resistor 118 aims to reduce an unstable operation such as oscillations. However, either one of them or another one capable of obtaining a similar effect may be used.

Embodiment 24

Figure 31:
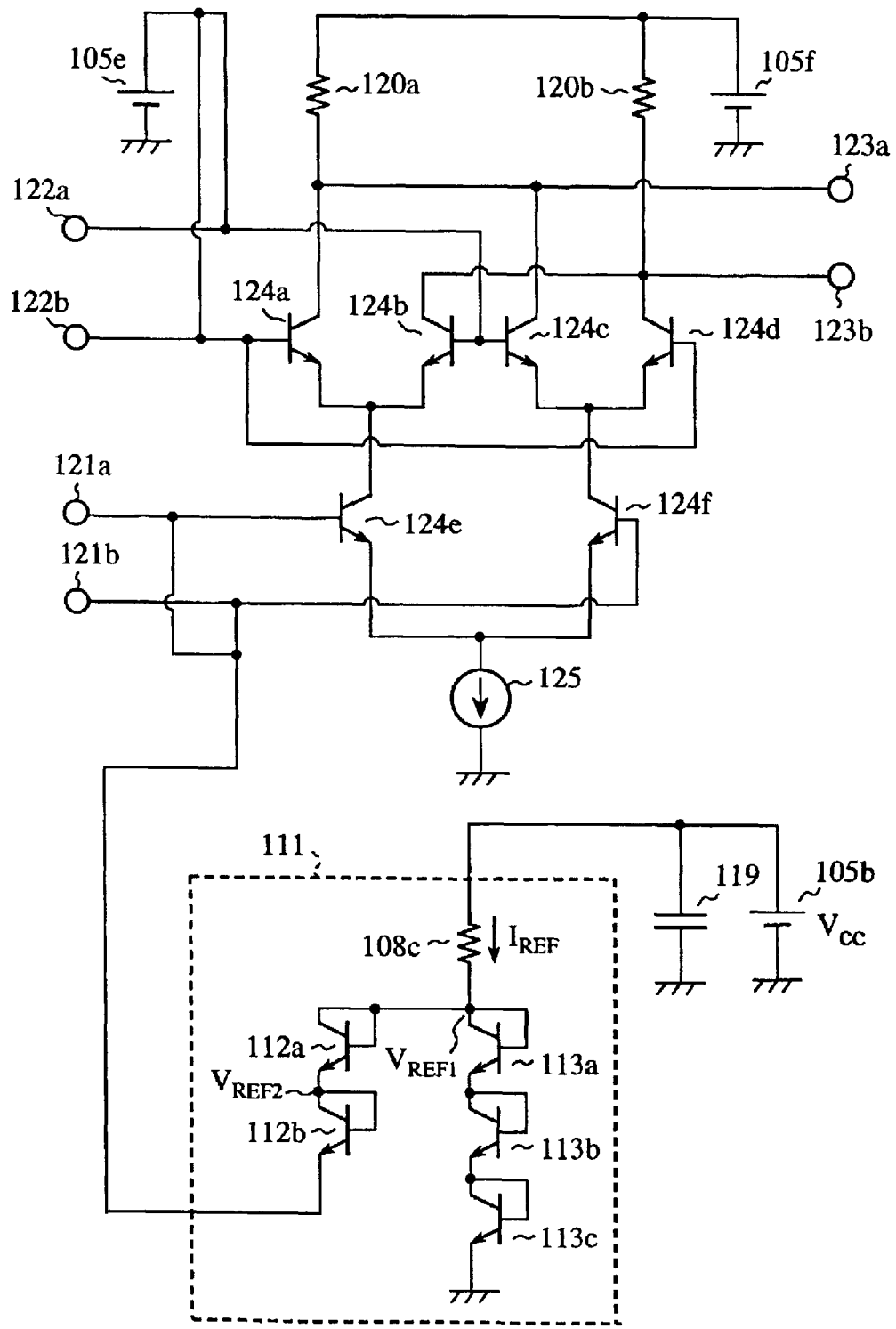
FIG. 31 is a circuit diagram to illustrate a high frequency amplifier which is an embodiment 24 of the present invention.

FIG. 31 shows a frequency mixer illustrative of an embodiment 24 of the present invention. The present embodiment is one in that, for example, the configuration (which, however, corresponds to a configuration in which the constant current source 104b is implemented by a constant voltage source 105b and a resistor 108c) for applying a DC bias to the base terminal of the amplifying bipolar transistor 103 in the high frequency amplifier according to the embodiment 12 is applied to frequency-mixing bipolar transistors 124e and 124f.

Namely, the frequency mixer according to the embodiment 24 is one in that the base DC bias applying configuration of the high frequency amplifier according to the embodiment 12 is applied to at least either one of a bipolar transistor for the input of a high frequency signal and a bipolar transistor for the input of a local oscillation wave.

Owing to the embodiment 24 having such a configuration, a frequency mixer can be obtained which simultaneously satisfies resistance to a change in power supply voltage and variations in transistor, which is an advantageous at a constant current operation, and a high saturation characteristic and the effect of reducing degradation of a noise figure, each of which is advantageous at a constant voltage operation.

Incidentally, even if the configuration is applied to frequency-mixing bipolar transistors 124a through 124d, a similar effect is obtained. Even if any base DC bias applying configuration of the embodiments 11 through 23 is applied, an effect similar to each of the embodiments is obtained.

INDUSTRIAL APPLICABILITY

As described above, a high frequency amplifier according to the present invention is suitable for use in a high input/high output high frequency amplifier and the like.

What is claimed is:

1. A high frequency amplifier in which a common emitter bipolar transistor is used, wherein a DC bias to a base terminal of the bipolar transistor is applied:

by a constant current biasing operation when a power level of a high frequency signal input to the bipolar transistor or a power level of a high frequency signal output therefrom, is a linear operation level of the bipolar transistor; and by a constant voltage biasing operation when said power level of the high frequency signal input to the bipolar transistor or said power level of the high frequency signal output therefrom, is a non-linear operation level of the bipolar transistor.

2. The high frequency amplifier according to claim 1, wherein said constant current biasing operation and said constant voltage biasing operation are performed by connecting at least one of a constant current source and a constant voltage source.

3. The high frequency amplifier to claim 2, wherein said constant current source is always connected to the base terminal during said constant current biasing operation.

4. The high frequency amplifier according to claim 3, wherein said constant voltage source is connected to the base terminal of the bipolar transistor through a resistor.

5. The high frequency amplifier according to claim 1, wherein said constant current biasing operation and said constant voltage biasing operation are performed by:

a current mirror bias circuit to supply the DC bias to said base terminal of the bipolar transistor; and a base bias compensating circuit which includes a constant current source and a connecting unit driven by a base potential of the bipolar transistor and one terminal of the connecting unit is connected to the base terminal of the bipolar transistor and the other terminal thereof is connected to the constant current source.

6. The high frequency amplifier according to claim 5, wherein said constant current source constituting the base bias compensating circuit is implemented by a resistor and a constant voltage source, said connecting unit is configured as a diode switch in which a base and collector of a bipolar transistor are short-circuit connected, an emitter terminal of the diode switch is connected to the base terminal of the common emitter bipolar transistor, a collector/base terminals thereof are connected to the resistor, and a reference voltage for the diode switch is supplied from series-connected diode switches more than at least one.

7. The high frequency amplifier according to claim 5, wherein said base bias compensating circuit is connected to a base terminal of a common emitter bipolar transistor through a resistor.

8. The high frequency amplifier according to claim 1, wherein said constant current biasing operation and said constant voltage biasing operation are performed by:

a current mirror bias circuit to supply the DC bias to said base terminal of the bipolar transistor; and a base bias compensating circuit which includes a constant current source and a connecting unit driven by a base potential of the bipolar transistor and one terminal of the connecting unit is connected to the constant current source and the base terminal of the bipolar transistor and the other terminal thereof is grounded.

9. The high frequency amplifier according to claim 8, wherein said constant current source constituting the base bias compensating circuit is implemented by a resistor and a constant voltage source, the connecting unit is configured as a diode switch in which a base and collector of a bipolar transistor are short-circuit connected, collector/base terminals of the diode switch are connected to the base terminal of the common emitter bipolar transistor, and an emitter terminal thereof is grounded.

10. The high frequency amplifier according to claim 8, wherein said base bias compensating circuit is connected to a base terminal of a common emitter bipolar transistor through a resistor.

11. A frequency mixer, wherein a DC bias is applied to a base of at least one of a bipolar transistor for the input of a high frequency signal and a bipolar transistor for the input of a local oscillation wave by using a configuration for applying the DC bias in the high frequency amplifier according to claim 2.

12. A frequency mixer, wherein a DC bias is applied to a base of at least one of a bipolar transistor for the input of a high frequency signal and a bipolar transistor for the input of a local oscillation wave by using a configuration for applying the DC bias in the high frequency amplifier according to claim 5.

13. A frequency mixer, wherein a DC bias is applied to a base of at least one of a bipolar transistor for the input of a high frequency signal and a bipolar transistor for the input of a local oscillation wave by using a configuration for applying the DC bias in the high frequency amplifier according to claim 8.

14. The high frequency amplifier according to claim 1, wherein said constant current biasing operation and said constant voltage biasing operation are performed by:
 a current mirror bias circuit to supply the DC bias to said base terminal of the bipolar transistor, and
 a base bias compensating circuit which includes a constant current source and series-connected two connecting units driven by a base potential of the bipolar transistor and one terminal of the series-connected connecting units is connected to the base terminal of the bipolar transistor and the other terminal thereof is connected to the constant current source.

15. The high frequency amplifier according to claim 14, wherein said constant current source constituting the base bias compensating circuit is implemented by a resistor and a constant voltage source, each of said connecting units is configured as a diode switch in which a base and collector of a bipolar transistor are short-circuit connected, an emitter terminal of the first diode switch thereof and collector/base terminals of the second diode switch thereof are connected in series, an emitter terminal of the second diode switch is connected to the base terminal of the common emitter bipolar transistor, collector/base terminals of the first diode switch are connected to the resistor, and a reference voltage for the diode switches is supplied from series-connected diode switches more than at least one.

16. The high frequency amplifier according to claim 1, wherein said constant current biasing operation and said constant voltage biasing operation are performed by:
 a constant current source and a resistor to supply the DC bias to said base terminal of the bipolar transistor; and
 a base bias compensating circuit which includes a second constant current source and at least one connecting unit driven by a base potential of the bipolar transistor and one terminal of the connecting unit is connected to the base terminal of the bipolar transistor and the other terminal thereof is connected to the second constant current source.

17. The high frequency amplifier according to claim 1, wherein said constant current biasing operation and said constant voltage biasing operation are performed by:
 a current mirror bias circuit to supply the DC bias to said base terminal of the bipolar transistor; and
 a base bias compensating bipolar transistor whose collector terminal and base terminal are connected to a constant voltage source, and whose emitter terminal is connected to the base terminal of the common emitter bipolar transistor.

18. The high frequency amplifier according to claim 17, wherein said constant voltage source connected to the base terminal of the base bias compensating bipolar transistor comprises a constant current source and at least one diode switch or more, each having collector/base terminals short-circuit connected.

19. The high frequency amplifier according to claim 17, wherein a diode switch whose collector/base terminals are short-circuited, is inserted between the emitter terminal of the base bias compensating bipolar transistor and the base terminal of the common emitter bipolar transistor.

20. The high frequency amplifier according to claim 18, wherein a diode switch whose collector/base terminals are short-circuited, is inserted between the emitter terminal of the base bias compensating bipolar transistor and the base terminal of the common emitter bipolar transistor.

21. The high frequency amplifier according to claim 17, wherein a resistor is inserted between the emitter terminal of the base bias compensating bipolar transistor and the base terminal of the common emitter bipolar transistor.

22. The high frequency amplifier according to claim 18 wherein a resistor is inserted between the emitter terminal of the base bias compensating bipolar transistor and the base terminal of the common emitter bipolar transistor.

23. A frequency mixer, wherein said base DC bias applying configuration of the high frequency amplifier according to claim 14 is applied to at least one of a bipolar transistor for the input of a high frequency signal and a bipolar transistor for the input of a local oscillation wave.

24. A frequency mixer, wherein said base DC bias applying configuration of the high frequency amplifier according to claim 16 is applied to at least one of a bipolar transistor for the input of a high frequency signal and a bipolar transistor for the input of a local oscillation wave.

25. A frequency mixer, wherein said base DC bias applying configuration of the high frequency amplifier according to claim 17 is applied to at least one of a bipolar transistor for the input of a high frequency signal and a bipolar transistor for the input of a local oscillation wave.

* * * * *